United States Patent
Sun et al.

(10) Patent No.: US 10,775,462 B2
(45) Date of Patent: Sep. 15, 2020

(54) SYSTEM AND METHOD FOR DIRECT SATURATION-CORRECTED CHEMICAL EXCHANGE SATURATION TRANSFER (DISC-CEST)

(71) Applicant: The General Hospital Corporation, Boston, MA (US)

(72) Inventors: Phillip Zhe Sun, Woburn, MA (US); Iris Yuwen Zhou, Winthrop, MA (US)

(73) Assignee: The General Hospital Corporation, Boston, MA (US)

( * ) Notice: Subject to any disclaimer, the term of this patent is extended or adjusted under 35 U.S.C. 154(b) by 96 days.

(21) Appl. No.: 16/027,895

(22) Filed: Jul. 5, 2018

(65) Prior Publication Data

US 2019/0011516 A1 Jan. 10, 2019

Related U.S. Application Data

(60) Provisional application No. 62/528,753, filed on Jul. 5, 2017.

(51) Int. Cl.
| | |
|---|---|
| *G01R 33/483* | (2006.01) |
| *G01R 33/56* | (2006.01) |
| *G01R 33/485* | (2006.01) |
| *G01R 33/50* | (2006.01) |

(52) U.S. Cl.
CPC ....... *G01R 33/4838* (2013.01); *G01R 33/485* (2013.01); *G01R 33/5605* (2013.01); *G01R 33/5608* (2013.01); *G01R 33/50* (2013.01)

(58) Field of Classification Search
CPC ............ G01R 33/4838; G01R 33/5605; G01R 33/5608; G01R 33/485; G01R 33/50
See application file for complete search history.

(56) References Cited

U.S. PATENT DOCUMENTS

| | | | | |
|---|---|---|---|---|
| 2008/0197840 | A1* | 8/2008 | Van Zijl | ................. G01N 24/08 324/307 |
| 2012/0286781 | A1* | 11/2012 | van Zijl | ............. G01R 33/5601 324/309 |
| 2013/0147477 | A1* | 6/2013 | Singh | ..................... G01R 33/20 324/309 |

(Continued)

OTHER PUBLICATIONS

Cai, et al., Magnetic Resonance Imaging of Glutamate, Nat. Med., 2012, 18(2):302-306.

(Continued)

*Primary Examiner* — Dominic E Hawkins
(74) *Attorney, Agent, or Firm* — Quarles & Brady LLP

(57) ABSTRACT

A system and method is provided that includes acquiring chemical exchange saturation transfer (CEST) data with the MRI system and generating an acquired Z-spectrum (Z) from the CEST data. The system and method also includes computing an estimated direct water saturation (Z') based using at least one of relaxation measurements derived from the CEST data or imaging parameters used to acquire the CEST data with the MRI system, computing a direct saturation corrected Z-spectrum ($\Delta Z$) using the acquired Z-spectrum (Z) and the estimated direct water saturation (Z'), and generating a CEST image of the subject using the direct saturation corrected Z-spectrum ($\Delta Z$).

19 Claims, 11 Drawing Sheets
(7 of 11 Drawing Sheet(s) Filed in Color)

(56) References Cited

U.S. PATENT DOCUMENTS

| | | | | |
|---|---|---|---|---|
| 2015/0051474 | A1* | 2/2015 | Eggers | G01R 33/5605 600/410 |
| 2016/0187445 | A1* | 6/2016 | McMahon | G01R 33/5616 600/420 |
| 2017/0227619 | A1* | 8/2017 | Reddy | A61B 5/4848 |
| 2018/0268546 | A1 | 9/2018 | Sun et al. | |

OTHER PUBLICATIONS

Cai, et al., CEST Signal at 2ppm (CEST@2ppm) from Z-Spectral Fitting Correlates with Creatine Distribution in Brain Tumor, NMR in Biomedicine, 2015, 28(1):1-8.

Chan, et al., Natural D-Glucose as a Biodegradable MRI Contrast Agent for Detecting Cancer, Magnetic Resonance in Medicine, 2012, 68:1764-1773.

Chen, et al., Evaluations of Extracellular pH Within In Vivo Tumors Using acidoCEST MRI, Magnetic Resonance in Medicine, 2014, 72:1408-1417.

Davis, et al., Glutamate Imaging (GluCEST) Lateralizes Epileptic Foci in Non-Lesional Temporal Lobe Epilepsy, Sci. Transl. Med., 2015, 7(309):309ra161.

Desmond, et al., Mapping of Amide, Amine, and Aliphatic Peaks in the CEST Spectra of Murine Xenografts at 7 T, Magnetic Resonance in Medicine, 2014, 71:1841-1853.

Fulci, et al., Cyclophosphamide Enhances Glioma Virotherapy by Inhibiting Innate Immune Responses, PNAS, 2006, 103(34):12873-12878.

Gerigk, et al., 7 Tesla Imaging of Cerebral Radiation Necrosis After Arteriovenous Malformations Treatment Using Amide Proton Transfer (APT) Imaging, Journal of Magnetic Resonance Imaging, 2012, 35:1207-1209.

Gore, et al., An Analysis of Magnetic Cross-Relaxation Between Water and Methylene Protons in a Model System, Magnetic Resonance in Medicine, 1989, 9(3):333-342.

Guo, et al., pH-sensitive MRI Demarcates Graded Tissue Acidification During Acute Stroke—pH Specificity Enhancement with Magnetization Transfer and Relaxation—Normalized Amide Proton Transfer (APT) MRI, NeuroImage, 2016, 141:242-249.

Haris, et al., In Vivo Magnetic Resonance Imaging of Tumor Protease Activity, Scientific Reports, 2014, 4:6081, 5 pages.

Heo, et al., Whole-Brain Amide Proton Transfer (APT) and Nuclear Overhauser Enhancement (NOE) Imaging in Glioma Patients Using Low-Power Steady-State Pulsed CEST Imaging at 7T, Journal of Magnetic Resonance Imaging, 2016, 44(1):41-50.

Heo, et al., Quantitative Assessment of Amide Proton Transfer (APT) and Nuclear Overhauser Enhancement (NOE) Imaging with Extrapolated Semi-Solid Magnetization Transfer Reference (EMR) Signals: Application to a Rat Glioma Model at 4.7 T, Magnetic Resonance in Medicine, 2016, 75(1):137-149.

Jiang, et al., A Theoretical Analysis of Chemical Exchange Saturation Transfer Echo Planar Imaging (CEST-EPI) Steady State Solution and the CEST Sensitivity Efficiency-Based Optimization Approach, Contrast Media Mol. Imaging, 2016, 11:415-423.

Jin, et al., MR Imaging of the Amide-Proton Transfer Effect and the pH-Insensitive Nuclear Overhauser Effect at 9.4 T, Magnetic Resonance in Medicine, 2013, 69:760-770.

Jones, et al., Nuclear Overhauser Enhancement (NOE) Imaging in the Human Brain at 7 T, NeuroImage, 2013, 77:114-124.

Jones, et al., Amide Proton Transfer Imaging of Human Brain Tumors at 3T, Magnetic Resonance in Medicine, 2006, 56:585-592.

Kim, et al., Water Saturation Shift Referencing (WASSR) for Chemical Exchange Saturation Transfer (CEST) Experiments, Magnetic Resonance in Medicine, 2009, 61:1441-1450.

Lee, et al., Quantitative Assessment of the Effects of Water Proton Concentration and Water T1 Changes on Amide Proton Transfer (APT) and Nuclear Overhauser Enhancement (NOE) MRI: The Origin of the APT Imaging Signal in Brain Tumor, Magnetic Resonance in Medicine, 2017, 77(2):855-863.

Liu et al., Quantitative Characterization of Nuclear Overhauser Enhancement and Amide Proton Transfer Effects in the Human Brain at 7 Tesla, Magnetic Resonance in Medicine, 2013, 70:1070-1081.

Mori, et al., Separation of Intramolecular NOE and Exchange Peaks in Water Exchange Spectroscopy Using Spin-Echo Filters, Journal of Biomolecular NMR, 1996, 7(1):77-82.

Mori, et al., Proton NMR Spectroscopy of Solvent-Saturable Resonances: A New Approach to Study pH Effects in Situ, Magnetic Resonance in Medicine, 1998, 40(1):36-42.

Mougin, et al., High-Resolution Imaging of Magnetisation Transfer and Nuclear Overhauser Effect in the Human Visual Cortex at 7 T, NMR in Biomedicine, 2013, 26(11):1508-1517.

Sagiyama, et al., In Vivo Chemical Exchange Saturation Transfer Imaging Allows Early Detection of a Therapeutic Response in Glioblastoma, PNAS, 2014, 111(12):4542-4547.

Sakata, et al., Grading Glial Tumors With Amide Proton Transfer MR Imaging: Different Analytical Approaches, Journal of Neuro-Oncology, 2015, 122(2):339-348.

Salhotra, et al., Amide Proton Transfer Imaging of 9L Gliosarcoma and Human Glioblastoma Xenografts, NMR in Biomedicine, 2008, 21(5):489-497.

Scheidegger, et al., Contributors to Contrast Between Glioma and Brain Tissue in Chemical Exchange Saturation Transfer Sensitive Imaging at 3 Tesla, NeuroImage, 2014, 99:256-268.

Stancello, et al., Development and Validation of a Smoothing-Splines-Based Correction Method for Improving the Analysis of CEST-MR Images, Contrast Media Mol. Imaging, 2008, 3:136-149.

Sun, et al., Detection of the Ischemic Penumbra Using pH-Weighted MRI, Journal of Cerebral Blood Flow & Metabolism, 2007, 27:1129-1136.

Sun, et al., Early Experience of Translating pH-Weighted MRI to Image Human Subjects at 3 Tesla, Stroke, 2010, 41 (Suppl 1):S147-S151.

Sun, et al., Association Between pH-Weighted Endogenous Amide Proton Chemical Exchange Saturation Transfer MRI and Tissue Lactic Acidosis During Acute Ischemic Stroke, Journal of Cerebral Blood Flow & Metabolism, 2011, 31:1743-1750.

Sun, et al., Imaging Acute Ischemic Tissue Acidosis with pH-Sensitive Endogenous Amide Proton Transfer (APT) MRI—Correction of Tissue Relaxation and Concomitant RF Irradiation Effects Toward Mapping Quantitative Cerebral Tissue pH, NeuroImage, 2012, 60(1):1-6.

Tietze, et al., Assessment of Ischemic Penumbra in Human Hyperacute Stroke Patients Using Amide Proton Transfer (APT) Chemical Exchange Saturation Transfer (CEST) MRI, NMR in Biomedicine, 2014, 27(2):163-174.

Van Zijl, et al., Mechanism of Magnetization Transfer During On-Resonance Water Saturation. A New Approach to Detect Mobile Proteins, Peptides, and Lipids, Magnetic Resonance in Medicine, 2003, 49:440-449.

Walker-Samuel, et al., In Vivo Imaging of Glucose Uptake and Metabolism in Tumors, Nat. Med., 2013, 19 (8):1067-1072.

Ward, et al., A New Class of Contrast Agents for MRI Based on Proton Chemical Exchange Dependent Saturation Transfer (CEST), Journal of Magnetic Resonance, 2000, 143:79-87.

Windschuh, et al., Correction of B1-inhomogeneities for Relaxation-Compensated CEST Imaging at 7 T, NMR in Biomedicine, 2015, 28(5):529-537.

Xu, et al., On the Origins of Chemical Exchange Saturation Transfer (CEST) Contrast in Tumors at 9.4T, NMR in Biomedicine, 2014, 27(4):406-416.

Yan, et al., Assessing Amide Proton Transfer (APT) MRI Contrast Origins in 9 L Gliosarcoma in the Rat Brain Using Proteomic Analysis, Mol. Imaging Biol., 2015, 17(4):479-487.

Zaiss, et al., Quantitative Separation of CEST Effect from Magnetization Transfer and Spillover Effects by Lorentzian—Line-Fit Analysis of Z-Spectra, Journal of Magnetic Resonance, 2011, 211(2):149-155.

Zaiss, et al., MR Imaging of Protein Folding In Vitro Employing Nuclear-Overhauser-Mediated Saturation Transfer, NMR in Biomedicine, 2013, 26(12):1815-1822.

(56) References Cited

OTHER PUBLICATIONS

Zaiss, et al., Inverse Z-Spectrum Analysis for Spillover-, MT-, and T1-Corrected Steady-State Pulsed CEST-MRI—Application to pH-Weighted MRI of Acute Stroke, NMR in Biomedicine, 2014, 27(3):240-252.

Zaiss, et al., Relaxation-Compensated CEST-MRI of the Human Brain at 7 T: Unbiased Insight Into NOE and Amide Signal Changes in Human Glioblastoma, NeuroImage, 2015, 112:180-188.

Zhao et al., Quantitative Amide Proton Transfer Imaging with Reduced Interferences from Magnetization Transfer Asymmetry for Human Brain Tumors at 3T, Magnetic Resonance in Medicine, 2015, 74(1):208-216.

Zhou, et al., Amide Proton Transfer (APT) Contrast for Imaging of Brain Tumors, Magnetic Resonance in Medicine, 2003, 50:1120-1126.

Zhou, et al., Using the Amide Proton Signals of Intracellular Proteins and Peptides to Detect pH Effects in MRI, Nature Medicine, 2003, 9:1085-1090.

Zhou, et al., Practical Data Acquisition Method for Human Brain Tumor Amide Proton Transfer (APT) Imaging, Magnetic Resonance in Medicine, 2008, 60:842-849.

Zhou, et al., Differentiation Between Glioma and Radiation Necrosis Using Molecular Magnetic Resonance Imaging of Endogenous Proteins and Peptides, Nat. Med., 2011, 17(1):130-134.

Zhou, et al., Quantitative Chemical Exchange Saturation Transfer (CEST) MRI of Glioma Using Image Downsampling Expedited Adaptive Least-Squares (IDEAL) Fitting, Scientific Reports, 2017, 7:84, 10 pages.

\* cited by examiner

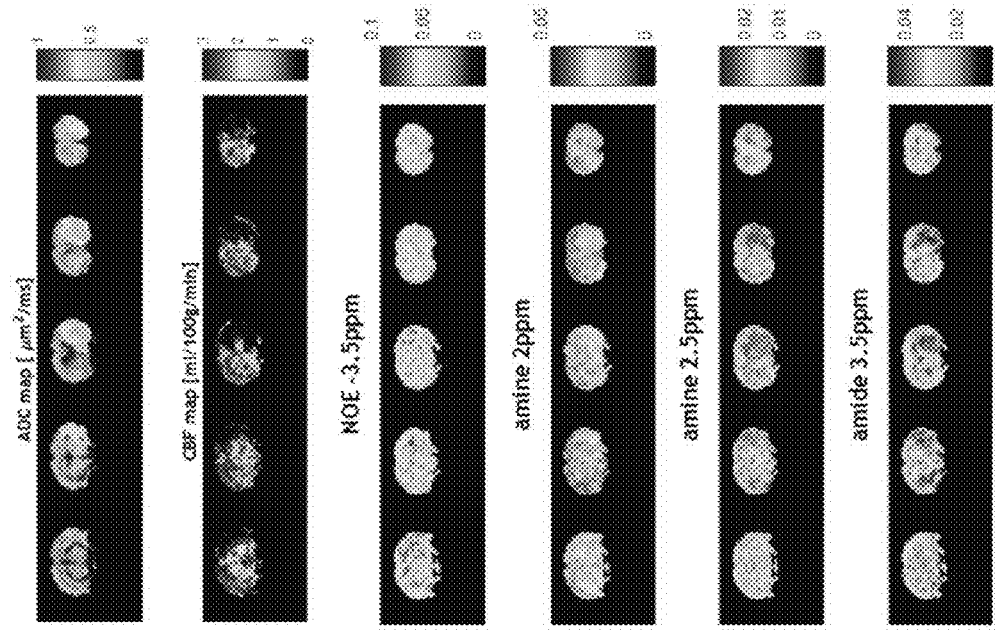
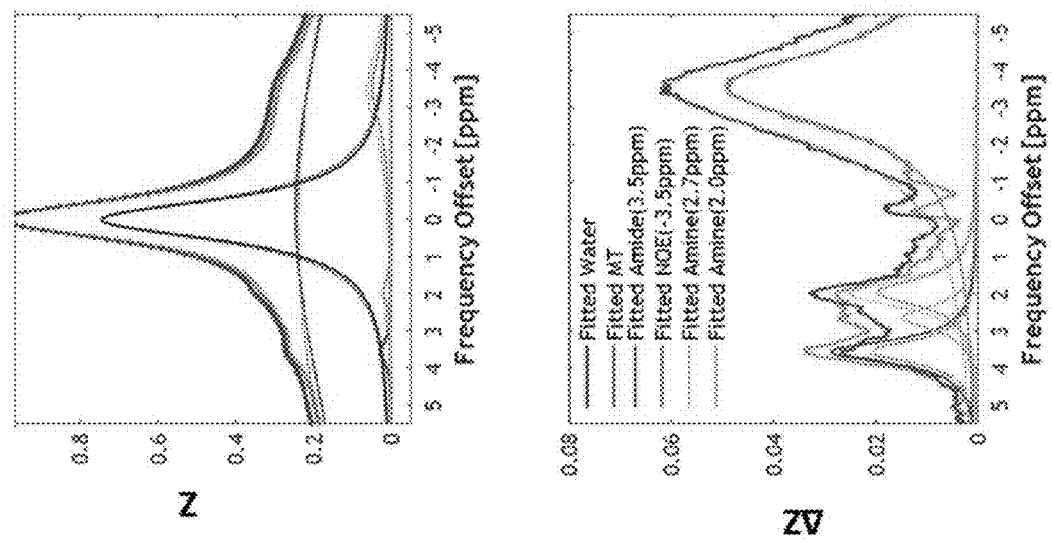
FIG. 11A
FIG. 11B

SYSTEM AND METHOD FOR DIRECT SATURATION-CORRECTED CHEMICAL EXCHANGE SATURATION TRANSFER (DISC-CEST)

CROSS-REFERENCE TO RELATED APPLICATIONS

This Application is based on, claims priority to, and incorporates herein by reference in its entirety U.S. Provisional Application Ser. No. 62/528,753, filed Jul. 5, 2017, and entitled, "DIRECT SATURATION-CORRECTED CHEMICAL EXCHANGE SATURATION TRANSFER (DISC-CEST)."

STATEMENT REGARDING FEDERALLY SPONSORED RESEARCH

This invention was made with government support under 1R01NS083654 and R21NS085574 awarded by the National Institutes of Health. The government has certain rights in the invention.

BACKGROUND

When a substance such as human tissue is subjected to a uniform magnetic field (polarizing field $B_0$), the individual magnetic moments of the nuclei in the tissue attempt to align with this polarizing field, but precess about it in random order at their characteristic Larmor frequency. If the substance, or tissue, is subjected to a magnetic field (excitation field $B_1$) that is in the x-y plane and that is near the Larmor frequency, the net aligned moment, $M_z$, may be rotated, or "tipped," into the x-y plane to produce a net transverse magnetic moment $M_{xy}$. A signal is emitted by the excited nuclei or "spins," after the excitation signal $B_1$ is terminated, and this signal may be received and processed to form an image.

When utilizing these "MR" (magnetic resonance) signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received MR signals are digitized and processed to reconstruct the image using one of many well-known reconstruction techniques.

The measurement cycle used to acquire each MR signal is performed under the direction of a pulse sequence produced by a pulse sequencer. Clinically available magnetic resonance imaging (MRI) systems store a library of such pulse sequences that can be prescribed to meet the needs of many different clinical applications. Research MRI systems include a library of clinically-proven pulse sequences and they also enable the development of new pulse sequences.

The MR signals acquired with an MRI system are signal samples of the subject of the examination in Fourier space, or what is often referred to in the art as "k-space." Each MR measurement cycle, or pulse sequence, typically samples a portion of k-space along a sampling trajectory characteristic of that pulse sequence. Most pulse sequences sample k-space in a raster scan-like pattern sometimes referred to as a "spin-warp," a "Fourier," a "rectilinear," or a "Cartesian" scan. The spin-warp scan technique employs a variable amplitude phase encoding magnetic field gradient pulse prior to the acquisition of MR spin-echo signals to phase encode spatial information in the direction of this gradient. In a two-dimensional implementation ("2DFT"), for example, spatial information is encoded in one direction by applying a phase encoding gradient, $G_y$, along that direction, and then a spin-echo signal is acquired in the presence of a readout magnetic field gradient, $G_x$, in a direction orthogonal to the phase encoding direction. The readout gradient present during the spin-echo acquisition encodes spatial information in the orthogonal direction. In a typical 2DFT pulse sequence, the magnitude of the phase encoding gradient pulse, $G_y$, is incremented, $\Delta G_y$, in the sequence of measurement cycles, or "views" that are acquired during the scan to produce a set of k-space MR data from which an entire image can be reconstructed.

MRI can be used to measure the exchange of magnetization between molecules to provide unique information about the chemical and molecular environment of samples or tissues. One type of such exchange measurement is broadly referred to in the field as magnetization transfer. This technique is capable of measuring the exchange of magnetization from spin species that have short transverse relaxation times ($T_2$). Because many different molecules have short $T_2$, this technique is not particularly sensitive to specific molecules.

A second type of magnetization exchange occurs between water protons and a molecule with long enough $T_2$ that its difference in frequency from water can be observed. Saturation of the magnetization from this molecule will generally decrease the measurable signal from water. This effect is generally referred to in the field as chemical exchange saturation transfer ("CEST"). Two different types of molecules can generate CEST effects: endogenous, or naturally occurring, molecules and exogenous contrast agents. In either instance, the molecules whose chemical exchange with water produces the CEST effect are generally referred to as so-called "exchangeable protons."

The CEST imaging method offers three advantages over traditional molecular MRI techniques. First, in some cases the molecules of interest within the subject can be directly detected. This feature mitigates the need for administering contrast agents to the subject. Second, the image contrast mechanism can be controlled with the RF pulses produced by the MRI system and, as such, can be turned on and off when desired. This control allows the location of specific molecules of interest to be detected by comparing images having the desired contrast present to those where it has been turned off. Lastly, the CEST imaging method is far more sensitive than traditional molecular MRI techniques, making it able to detect substantially low concentrations of given molecules.

Thus, CEST MRI is a sensitive imaging technique for detecting compounds containing exchangeable protons. Such labile protons can be selectively saturated by an RF pulse, and the saturation subsequently transferred to the bulk water signal via proton chemical exchange, resulting in substantial sensitivity enhancement. CEST imaging has been demonstrated in mapping low-concentration metabolites such as creatine (Cr), glucose, glutamate, and changes in microenvironment properties such as temperature and pH, promising a host of in vivo applications such as imaging of ischemic stroke and tumor. One example is amide proton transfer (APT), a specific form of CEST imaging that is sensitive to pH and mobile protein/peptide content. Recently, APT imaging has shown promising results in characterizing tissue acidosis after ischemic stroke, tumor detection, grading, and differentiation of tumor recurrence from radiation necrosis.

Despite holding promises in stroke and tumor imaging, CEST MRI suffers from its qualitative nature, which depends on many factors, including the chemical exchange rate, concentration of exchangeable protons, longitudinal relaxation time, and RF saturation power. To quantify the CEST effect relative to, for example APT, an asymmetry analysis ($MTR_{asym}$) is most commonly used to suppress interference from non-linear direct water saturation (RF spillover) and broadband magnetization transfer (MT) effects by taking the difference between a reference image (e.g. −3.5 ppm) and label imagine (e.g. +3.5 ppm). Note the term 'direct water saturation' is used interchangeably with 'RF spillover' or 'direct saturation' or 'spillover' in this context. However, in vivo $MTR_{asym}$ is contaminated by asymmetric magnetization transfer contrasts (MTC) from semisolid macromolecules and nuclear overhauser enhancement (NOE) effects, which result in a negative and inhomogeneous shift across the brain. As such, in vivo $MTR_{asym}$ has a mixed contribution from APT, asymmetric NOE and MTC effects. If the asymmetric background signals are not removed the result is a substantial underestimation of the CEST effect. Another drawback associated with the $MTR_{asym}$ method is that $MTR_{asym}$ analysis is subjected to static magnetic ($B_0$) field inhomogeneity, which needs additional acquisition of densely sampled Z-spectrum to correct for $B_0$ inhomogeneity using interpolation approach. The dominant $B_0$ inhomogeneity effect also stems from the non-linear direct saturation effect.

Therefore, it would be desirable to develop quantitative methods that can determine in vivo CEST effects without the need of time-consuming Z-spectrum acquisition while controlling for confounding contaminations.

SUMMARY OF THE PRESENT DISCLOSURE

The present disclosure addresses the aforementioned drawbacks by providing systems and methods for performing analysis using a direct saturation effect-corrected analysis, which can simplify decoupling of CEST effects from information that is contaminating for in vivo quantifications. In particular, the systems and methods provided herein can be used to control against B0 inhomogeneity effects on CEST data and suppress the concomitant water signal during CEST imaging studies, which results in CEST images with higher contrast and less background contamination. Furthermore, the systems and methods can be used to provide reliable in vivo CEST quantification with three CEST images, which can be used to reduce the data acquisition times.

In accordance with one aspect of the disclosure, a method is provided for producing a magnetic resonance (MR) image of a subject. The method includes applying at least one radiofrequency (RF) saturation pulse with an MRI system at a range of frequencies to substantially saturate magnetization corresponding to an exchangeable proton in the subject, acquiring chemical exchange saturation transfer (CEST) data with the MRI system, and generating an acquired Z-spectrum (Z) from the CEST data. The method also includes computing an estimated direct water saturation (Z') based using at least one of relaxation measurements derived from the CEST data or imaging parameters used to acquire the CEST data with the MRI system, computing a direct saturation corrected Z-spectrum ($\Delta Z$) using the acquired Z-spectrum (Z) and the estimated direct water saturation (Z'), and generating a CEST image of the subject using the direct saturation corrected Z-spectrum ($\Delta Z$).

In accordance with another aspect of the present disclosure, system is provided that includes a magnet system configured to generate a polarizing magnetic field about at least a portion of a subject, a magnetic gradient system including a plurality of magnetic gradient coils configured to apply at least one magnetic gradient field to the polarizing magnetic field, and a radio frequency (RF) system configured to apply an RF field to the subject and to receive magnetic resonance signals from the subject using a coil array. The system also includes a computer system programmed to control the magnetic gradient system and the RF system to perform a pulse sequence that includes at least one RF saturation pulse at a range of frequencies to substantially saturate magnetization corresponding to an exchangeable proton in the subject. The computer system is further programmed to acquire chemical exchange saturation transfer (CEST) data from the subject, generate an acquired Z-spectrum (Z) from the CEST data, and compute an estimated direct water saturation (Z') based using at least one of relaxation measurements derived from the CEST data or imaging parameters used to acquire the CEST data with the MRI system. The computer system is further programmed to determine a direct saturation corrected Z-spectrum ($\Delta Z$) using the Z-spectrum (Z) and the estimated direct water saturation (Z'); and reconstruct a CEST image of the subject using the direct saturation corrected Z-spectrum ($\Delta Z$).

The foregoing and other aspects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims and herein for interpreting the scope of the invention.

BRIEF DESCRIPTION OF THE DRAWINGS

The patent or patent application file contains at least one drawing in color. Copies of this patent or patent application publication with color drawings will be provided by the Office upon request and payment of the necessary fee.

FIG. 11A is a multi-pool Lorentzian fitting of an averaged Z-spectrum (Z) or direct saturation corrected Z-spectrum (ΔZ) from contralateral normal tissue (green) or ipsilateral ischemic tissue (red) from a representative rat brain with focal ischemic stroke. Individual decoupled CEST pools, including water, APT, amine, NOE and MT are also shown (normal: solid lines; ischemic: dotted lines).

FIG. 11B are diffusion and perfusion MRI maps of one ischemic rat brain as well as the decoupled APT, amine, NOE maps using multi-pool Lorentzian fitting of the direct saturation corrected ΔZ.

DETAILED DESCRIPTION OF THE PRESENT DISCLOSURE

Figure 1A:
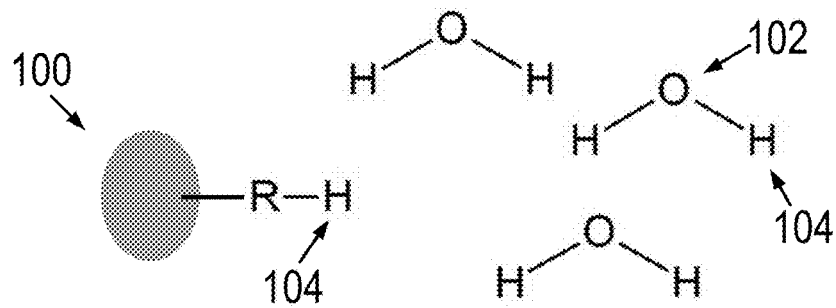
FIG. 1A is a schematic illustration of a small quantity of metabolite dissolved in a solvent, where each of the metabolite and the solvent include exchangeable protons in chemical exchange.
Figure 1B:
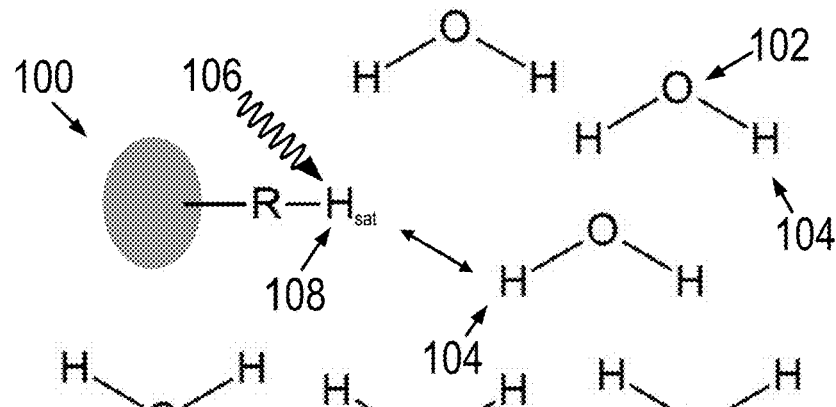
FIG. 1B is a schematic illustration of an RF pulse being applied to the exchangeable proton on the metabolite to form a saturated proton, where the saturated proton is in chemical exchange with the solvent.
Figure 1C:
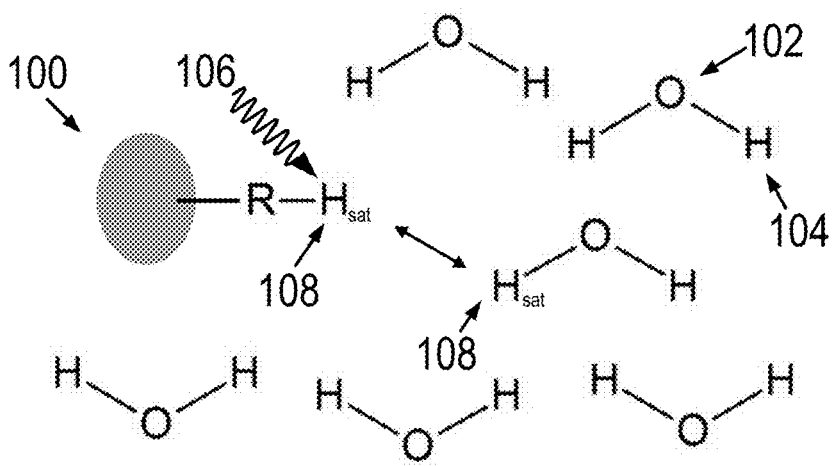
FIG. 1C is a schematic illustration of the saturated proton being transferred to the solvent resulting in a loss of solvent signal over time.

Chemical Exchange Saturation Transfer (CEST) MRI emerges as a sensitive molecular MR imaging technique that detects exchangeable groups via their interactions with bulk tissue water. Referring now to FIGS. 1A-1C, a schematic illustration is shown to illustrate magnetization transfer via chemical exchange between a metabolite and a bulk solvent solution, which is exploited to achieve CEST contrast. FIG. 1A shows a metabolite 100 dissolved in a solvent 102 where both the metabolite 100 and the solvent 102 comprise an exchangeable proton 104. FIG. 1B shows an exchangeable proton 104 being selectively saturated by an RF pulse 106 to produce a saturated proton 108. Magnetic saturation will spontaneously be transferred to the solvent 102 overtime due to chemical exchange of the saturated proton 108 with the exchangeable protons 104.

This process continues to produce a reduction in the solvent 102 signal over time, which may be detected using MR imaging. The loss of solvent 102 signal provides an indirect measure for the concentration of the metabolite 100 in the solution, which may be visualized from the variation in the solvent 102 signal as a function of offset frequency of the irradiation pulse, known as a Z-spectrum. CEST imaging has been demonstrated in mapping low-concentration endogenous metabolites 100 with exchangeable protons 104 such as metabolites 100 with amide (—NH), amine ($NH_2$) and hydroxyl (—OH) functional groups. Typically, the solvent 102 comprises water, but could conceivably be any solvent 102 that includes an exchangeable proton 104. CEST imaging has also been used to map dilute metabolites and to track changes in microenvironment properties such as temperature and pH, promising a host of in vivo applications such as imaging of ischemic stroke and tumor.

Figure 2A:
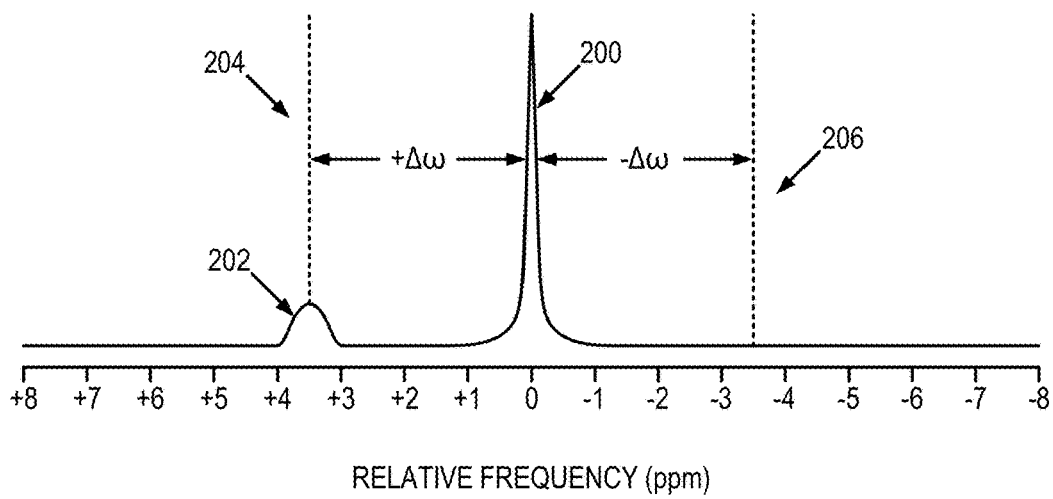
FIG. 2A is a graphic illustration of an exemplary frequency spectrum that includes a water proton resonance peak and an amide proton resonance peak, which relates to one specific example of the more general group of other labile protons groups and semisolid macromolecules.
Figure 2B:
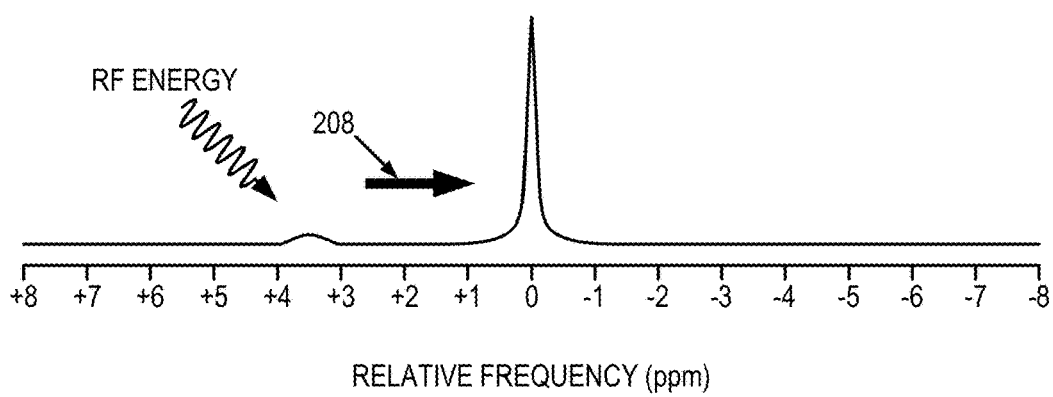
FIG. 2B is a graphic illustration of the effect of the application of radio frequency ("RF") energy at a labeling frequency that is around the resonance frequency of an exchangeable proton, such as an amide proton, on detectable signal from water protons adjacent the exchangeable proton.
Figure 2C:
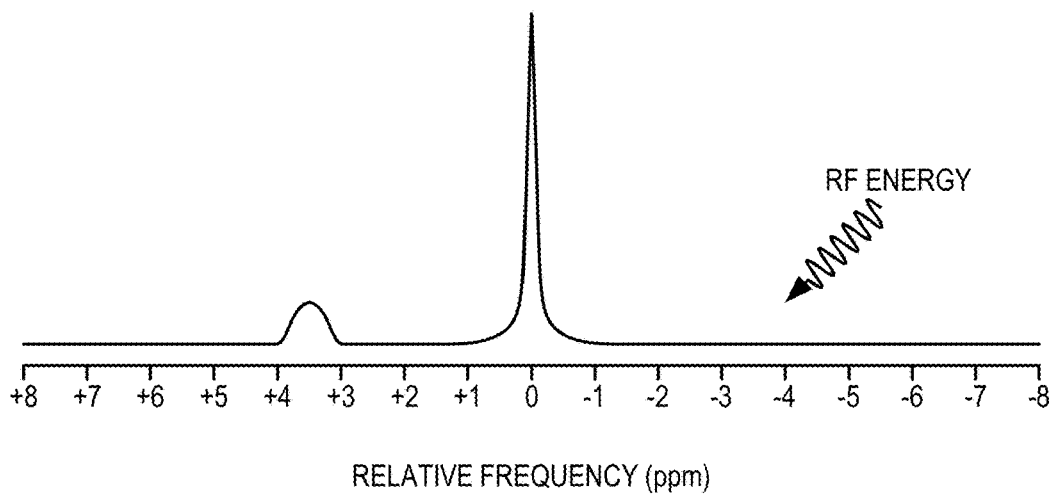
FIG. 2C is a graphic illustration of the effect of the application of RF energy at a reference frequency, equal to the negative of the labeling frequency, on detectable signal from water protons adjacent the exchangeable proton.

Referring now to FIGS. 2A-2C, a graphic illustration of an exemplary method for producing the CEST Z-spectrum is shown. An exemplary Z-spectrum is illustrated in FIG. 2A, the spectrum including a spectral peak 200 corresponding to water protons and a spectral peak 202 corresponding to amide protons. The amide proton peak 202 exists at a frequency shift relative to the water peak 200. For example, there is a frequency shift of around +3.5 parts per million ("ppm") between the water peak 200 and the amide proton peak 202. Thus, a so-called "labeling spectral line" 204, or "labeling frequency," is centered at or around the resonance frequency of the exchangeable proton, which for an amide proton is shifted about +3.5 ppm relative to the water peak 200. In general, for CEST imaging, the labeling spectral line is selected as a frequency at or around the resonance frequency of the exchangeable proton. A so-called "reference spectral line" 206, or "reference frequency," also exists, and is equal to the negative of the labeling frequency relative to the water peak 200.

To obtain a Z-spectrum, a series of image data are acquired with an MRI system by applying RF energy at the labeling spectral line changing incrementally, for example from down-field 204 to up-field 206 of water resonance. If the labeling spectral line is applied at the resonance frequency of the exchangeable proton, the saturation of the exchangeable protons is transferred through chemical exchange processes to nearby water protons, as indicated by line 208 in FIG. 2B. As a result, the detectable signal from these solvent protons is reduced. Referring now to FIG. 2C, there is no saturation transferred to the adjacent water spins and, therefore, no resultant decrease in detectable signal. In this manner, a so-called "Z-spectrum" is acquired.

For in vivo CEST imaging, the CEST signal at a selected frequency at or around the resonance frequency of the exchangeable proton also contains concomitant contributions from magnetization transfer contrast (MTC), direct water saturation effect, and the nuclear overhauser enhancement (NOE) effects. MTC is similar to CEST, where saturated protons are transferred to non-saturated protons in water; however, MTC involves macromolecular magnetization transfer that have very short T2* and a broad spectrum. The direct water saturation effects, or RF spillover, includes an application of a saturation pulse that comprises side lobes, where the presence side lobes during applications of RF irradiations inevitably affects adjacent offset frequencies, such as the water-proton magnetization. The NOE effect may contribute to concomitant effects through intra- or inter-molecular dipolar cross-relaxation. Each of these factors contributes to measured CEST signals across the Z-spectrum to certain degree, limiting the specificity of CEST quantification.

Typically a CEST contrast image is assessed using a $MTR_{asym}$ map to suppress direct water saturation, which is the normalized difference between the labelling frequency 204 (i.e. 3.5 ppm) and the reference frequency 206 (i.e. −3.5 ppm) as shown below:

$$MTR_{asym} = \frac{s(-\omega) - s(\omega)}{s_0};$$ (Eq. 1)

where S(−ω) is the signal intensity at the references frequency, S(ω) is the signal intensity at the labelling frequency, and $S_0$ is the signal intensity without irradiation. However, asymmetric background signals contributed by MTC and NOE cannot be properly accounted for using this simplistic method. Other drawbacks associated with the $MTR_{asym}$ method is that $MTR_{asym}$ analysis is subjected to static magnetic ($B_0$) field inhomogeneity, which needs additional acquisition of densely-sampled Z-spectrum centered around the water resonance to correct for $B_0$ inhomogeneity.

Previous methods have been proposed to ameliorate the negative background signals associated with RF spillover, NOE and asymmetric MTC effects. One such method is a three-offset approach that subtracts the label image from the average of two boundary images to better quantify the background noise. In this method, the negative background signals are approximated using a linear function. As such, the apparent signal associated with the metabolite of interest may be calculated by taking the difference between the Z-spectrum and the linear approximation. The MTR(Δω) in the three-offset method is calculated by:

$$MTR(\Delta\omega) = \left\{ \frac{S(\Delta\omega + \delta) + S(\Delta\omega - \delta)}{2} - S(\Delta\omega) \right\};$$ (Eq. 2)

where Δω±δ are the frequency offsets of the two boundaries with equal offset shift δ from the peak of interest (Δω). However, the linear correction of the baseline underlying this simplistic approach makes it limited to quantification of CEST peaks far from the water resonance (i.e., large chemical shift or high field) under the condition of weak RF saturation level. If the condition is not met such as at sub-high field strength, the RF spillover effect cannot be approximated by a linear function, which results in substantial underestimation of the CEST effect.

Figure 3:
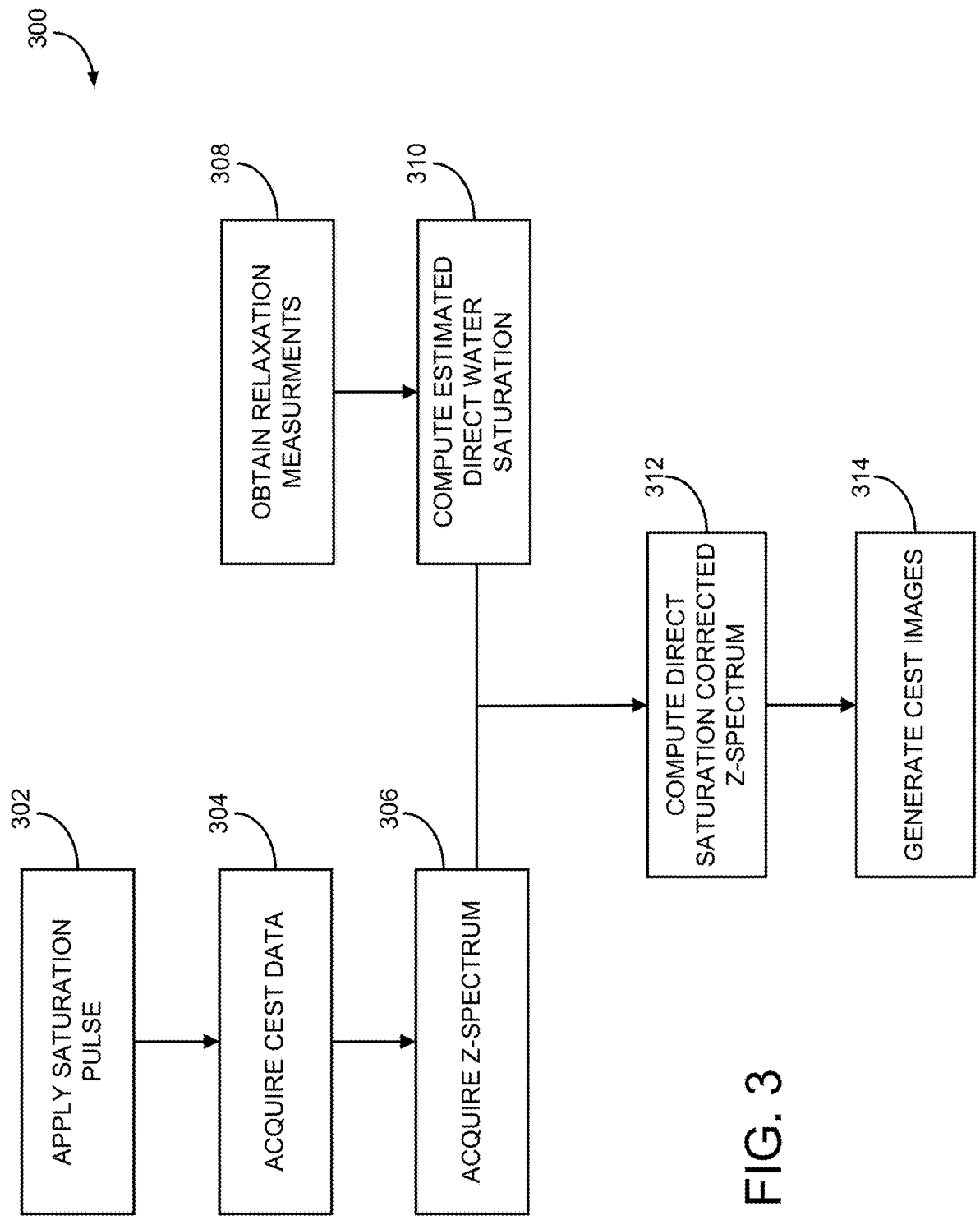
FIG. 3 is a flowchart setting forth the steps of applying a concomitant direct saturation correction (DISC) procedure according to one aspect of the present disclosure.

The present disclosure provides a relaxation-based, direct saturation-corrected CEST (DISC-CEST) analysis that addresses the limitations of the previous methods by providing an improved method for reducing concomitant contributions. FIG. 3 shows a flowchart setting forth the steps of an example method 300 for generating a magnetic resonance (MR) image of a subject using CEST data that is substantially free of concomitant contributions. The method includes applying at least one radiofrequency (RF) saturation pulse with an MRI system at a range of frequencies to substantially saturate magnetization corresponding to an exchangeable proton in the subject at process block 302. In some aspects, the saturation pulse may include a continuous wave irradiation such as a long rectangular RF pulse. In other aspects, the saturation pulse may include a train of RF saturation pulses such as Fermi or Gaussian pulses. Following saturation, CEST data may be acquired using the MRI system at process block 304. In some aspects, the CEST data may be acquired using an echo planar imaging (EPI) readout. In other aspects, the CEST data may be acquired using fast image readout such as Fast Low Angle SHot (FLASH) or turbo spin echo (TSE). Next, by incrementally changing the frequency of the RF saturation pulse, a Z-spectrum (Z) is generated at process block 306 from the CEST data. In some aspects, the Z-spectrum (Z) may be acquired by changing the RF saturation frequency using an incremental interval. The frequency range of saturation pulses typically covers from upfield of water resonance (e.g. −6 ppm) to downfield (e.g., +6 ppm) with small incremental intervals (e.g., 0.25 ppm). Following acquisition of the Z-spectrum, relaxation measurements may be obtained at process block 308. The relaxation measurements may include, as examples, a longitudinal relaxation value ($T_1$) and a transverse relaxation value ($T_2$).

The process may then continue at process block 310 by computing an estimated direct water saturation (Z') based at least in part on the relaxation measurements. In some aspects, the estimated direct water saturation comprises a non-linear function. In some non-limiting examples, the estimated direct water saturation may be based at least in part on parameters such as a relaxation recovery (Tr), saturation times (Ts), a flip angle (FA), a bulk water longitudinal relation rate ($R_{1w}$), a bulk water traverse relaxation rate ($R_{2w}$), and RF irradiation levels. At process block 312, the process 300 continues by computing a direct saturation corrected Z-spectrum (ΔZ) by taking the difference between the experimentally acquired Z-spectrum from process block 306 and the estimated direct saturation from process block 310. A CEST image may then be generated at process block 314 from the direct saturation corrected Z-spectrum from process block 312.

In the instance that the solvent is water, a simulated direct water saturation (Z') signal can be described by:

$$Z' = \frac{S_{sat}(R_{1p}, TR, FA, Ts, B_1)}{S_0(TR, FA)} = \frac{(1 - e^{-T_r R_{1w}}) \cdot e^{-R_{1p} \cdot Ts} + \frac{R_{1w} \cos^2\theta}{r_{1p}} \cdot (1 - e^{-R_{1p} \cdot Ts})}{1 - \cos(FA) \cdot e^{-T_r R_{1w}} \cdot e^{-R_{1p} \cdot Ts}};$$ (Eq. 3)

where $R_{1p} = R_{1w} \cos^2\theta + R_{2w} \sin^2\theta$, Tr and Ts are the relaxation recovery and saturation times (TR=Tr+Ts), FA is the image excitation flip angle, $R_{1,2w}$ are the bulk water longitudinal and traverse relaxation rates. In addition, $\theta = \tan^{-1}(\omega_1/\Delta\omega)$, where $\omega_1$ and Δω are the RF irradiation level and offset. In some aspects, the direct saturation corrected Z-spectrum (ΔZ) may be obtained by taking the difference between the experimentally acquired Z-spectrum (Z) created using data acquired from the subject and the estimated direct saturation (Z'), given as:

$$\Delta Z = Z' - Z \qquad (Eq.\ 4).$$

Using the direct saturation corrected Z-spectrum ($\Delta Z$), individual CEST effects such as APT, NOE and broad MTC effects can be decoupled, for example, with multi-pool Lorentzian fitting method. For example, the $\Delta Z$ spectrum can be fitted as the sum of multiple Lorentzian functions using the following equation:

$$\Delta Z = \sum_{i=1}^{N} \frac{A_i}{1 + 4\left(\frac{\omega - \omega_i}{\sigma_i}\right)^2}; \qquad (Eq.\ 5)$$

where $\omega$ is the frequency offset from the water resonance, $A_i$, $\omega_i$ and $\sigma_i$ are the amplitude, frequency offset, and linewidth, respectively, of the CEST peak for the proton pool i. A five-pool Lorentzian model (i=5), including magnetization transfer (MT), amide, amine, hydroxyl (—OH) and NOE may be employed.

Using the direct saturation corrected Z-spectrum ($\Delta Z$), the concomitant effects from direct saturation, NOE and broad MTC effects in the conventional analysis methods such as MTR asymmetry or three-offset method, may be reduced by using the frequency offset method, dubbed the DISC-CEST method:

$$MTR'(\Delta\omega) = \frac{\delta_1 \cdot \Delta Z(\Delta\omega + \delta_2) + \delta_2 \cdot \Delta Z(\Delta\omega - \delta_1)}{\delta_1 + \delta_2}; \qquad (Eq.\ 6)$$

where $\Delta\omega$ is the frequency offset of interest, $\delta_1$ is a first offset shift, and $\delta_2$ is a second offset shift. Different from multi-pool Lorentzian fitting of $\Delta Z$, which requires the acquisition of a Z-spectrum, the DISC-CEST minimally uses three offsets and drastically reduces the scan time. Unlike the previous three-offset method, the DISC-CEST method can use arbitrary boundary offsets defined by a first boundary offset, ($\Delta\omega + \delta_2$), and a second boundary offset, ($\Delta\omega - \delta_1$), respectively. In some aspects, the first offset shift may be different than the second offset shift. The $B_0$ field inhomogeneity effect can be taken into consideration by adjusting the frequency offsets measured from $B_0$ field map into $\Delta\omega$ for subsequent calculation of MTR'. In some aspects, the boundary offsets may be determined by choosing the peak with a minimum residual CEST effect. In other aspects, the boundary offsets can be determined using a first derivative of the Z-spectrum.

As will be detailed further below using Examples, the DISC-CEST correction more accurately models confounding concomitant contributions from direct saturation, NOE and broad MTC effects. Application of the DISC-CEST correction leads to a more accurate prediction of the CEST effect when compared with previous models. In some aspects, the DISC-CEST provides more reliable quantification of in vivo CEST measurement compared to the commonly used asymmetry analysis or three-offset method because the direct saturation is corrected; there is reduced contamination from the upfield NOE effect; and the broad MTC effect is assumed to be linear within a relatively small frequency range and is therefore reasonably accounted for in the DISC-CEST method.

In some aspects, the DISC-CEST method includes an acquisition of at least three frequency offsets, which may substantially reduce the scan times. The DISC-CEST method is not restricted to field strength or experimental conditions such as saturation pulses. The DISC-CEST method not only improves scanning efficiency but also has the potential to be applied in cancer and stroke imaging at clinical field strength.

In some aspects, the DISC-CEST method may be used to generate CEST images including APT, NOE and MTC maps. The DISC-CEST method more accurately models concomitant effects and results in CEST images with higher contrast. In other aspects, DISC-CEST method may be used in combination with quantitative analytical methods such as quantification of exchange rate with RF saturation time and power (QUEST and QUESP), ratiometric analysis and omega-plot analysis to generate a CEST quantitative metrics of in vivo or in vitro molecule concentrations and/or pH values. The molecule may include an amide, amine, or hydroxyl group that comprises an exchangeable proton.

The present disclosure recognizes that CEST imaging can provide clinical utility beyond the brain, such as when imaging other organs, including the heart or kidneys. That is, the present disclosure recognizes that pH estimated from CEST imaging to provide useful metabolic information, for example, to accompany conventional perfusion and diffusion MRI studies.

Figure 4:
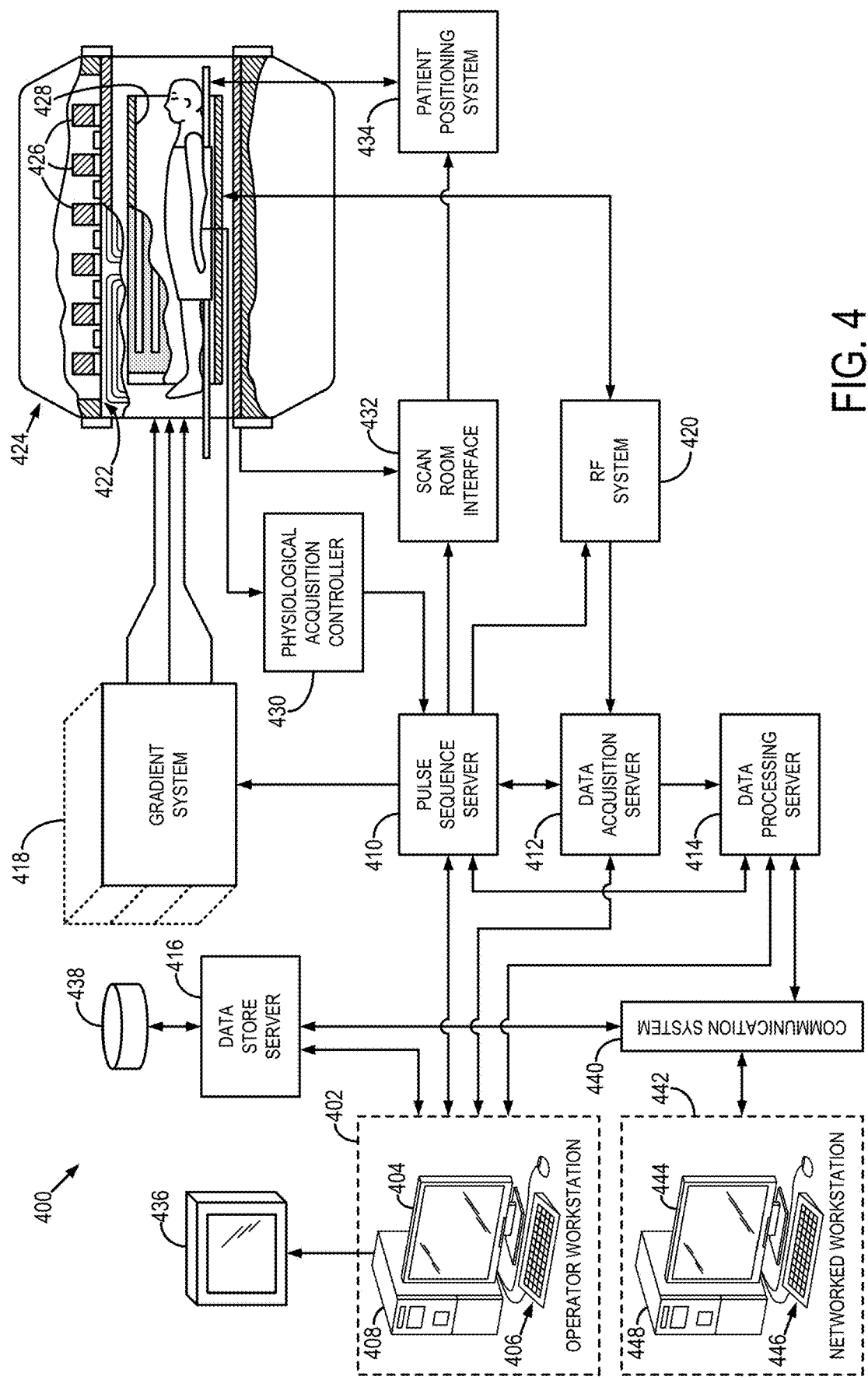
FIG. 4 is a block diagram of an example magnetic resonance imaging ("MRI") system that is configured to implement methods described here.

Referring particularly now to FIG. 4, an example of a magnetic resonance imaging ("MR") or nuclear magnetic resonance (NMR) system 400 that can implement the methods described here is illustrated. The MR system 400 includes an operator workstation 402 that may include a display 404, one or more input devices 406 (e.g., a keyboard, a mouse), and a processor 408. The processor 408 may include a commercially available programmable machine running a commercially available operating system. The operator workstation 402 provides an operator interface that facilitates entering scan parameters into the MR system 300. The operator workstation 402 may be coupled to different servers, including, for example, a pulse sequence server 410, a data acquisition server 412, a data processing server 414, and a data store server 416. The operator workstation 402 and the servers 410, 412, 414, and 416 may be connected via a communication system 440, which may include wired or wireless network connections.

The pulse sequence server 410 functions in response to instructions provided by the operator workstation 402 to operate a gradient system 418 and a radiofrequency ("RF") system 420. Gradient waveforms for performing a prescribed scan are produced and applied to the gradient system 418, which then excites gradient coils in an assembly 422 to produce the magnetic field gradients $G_x$, $G_y$, and $G_z$ that are used for spatially encoding magnetic resonance signals. The gradient coil assembly 422 forms part of a magnet assembly 424 that includes a polarizing magnet 426 and a whole-body RF coil 428.

RF waveforms are applied by the RF system 420 to the RF coil 428, or a separate local coil to perform the prescribed magnetic resonance pulse sequence. Responsive magnetic resonance signals detected by the RF coil 428, or a separate local coil, are received by the RF system 420. The responsive magnetic resonance signals may be amplified, demodulated, filtered, and digitized under direction of commands produced by the pulse sequence server 410. The RF system 420 includes an RF transmitter for producing a wide variety of RF pulses used in MR pulse sequences. The RF transmitter is responsive to the prescribed scan and direction from the pulse sequence server 410 to produce RF pulses of the desired frequency, phase, and pulse amplitude waveform. The generated RF pulses may be applied to the whole-body RF coil 428 or to one or more local coils or coil arrays.

The RF system 420 also includes one or more RF receiver channels. An RF receiver channel includes an RF preamplifier that amplifies the magnetic resonance signal received by the coil 428 to which it is connected, and a detector that detects and digitizes the I and Q quadrature components of the received magnetic resonance signal. The magnitude of the received magnetic resonance signal may, therefore, be determined at a sampled point by the square root of the sum of the squares of the I and Q components:

$$M=\sqrt{I^2+Q^2} \qquad \text{(Eq. 7);}$$

and the phase of the received magnetic resonance signal may also be determined according to the following relationship:

$$\varphi = \tan^{-1}\left(\frac{Q}{I}\right). \qquad \text{(Eq. 8)}$$

The pulse sequence server 410 may receive patient data from a physiological acquisition controller 430. By way of example, the physiological acquisition controller 430 may receive signals from a number of different sensors connected to the patient, including electrocardiograph ("ECG") signals from electrodes, or respiratory signals from a respiratory bellows or other respiratory monitoring devices. These signals may be used by the pulse sequence server 410 to synchronize, or "gate," the performance of the scan with the subject's heart beat or respiration.

The pulse sequence server 410 may also connect to a scan room interface circuit 432 that receives signals from various sensors associated with the condition of the patient and the magnet system. Through the scan room interface circuit 432, a patient positioning system 434 can receive commands to move the patient to desired positions during the scan.

The digitized magnetic resonance signal samples produced by the RF system 420 are received by the data acquisition server 412. The data acquisition server 412 operates in response to instructions downloaded from the operator workstation 302 to receive the real-time magnetic resonance data and provide buffer storage, so that data is not lost by data overrun. In some scans, the data acquisition server 412 passes the acquired magnetic resonance data to the data processor server 414. In scans that require information derived from acquired magnetic resonance data to control the further performance of the scan, the data acquisition server 412 may be programmed to produce such information and convey it to the pulse sequence server 410. For example, during pre-scans, magnetic resonance data may be acquired and used to calibrate the pulse sequence performed by the pulse sequence server 410. As another example, navigator signals may be acquired and used to adjust the operating parameters of the RF system 420 or the gradient system 418, or to control the view order in which k-space is sampled. In still another example, the data acquisition server 412 may also process magnetic resonance signals used to detect the arrival of a contrast agent in a magnetic resonance angiography ("MRA") scan.

The data processing server 414 receives magnetic resonance data from the data acquisition server 412 and processes the magnetic resonance data in accordance with instructions provided by the operator workstation 402. Such processing may include, for example, reconstructing two-dimensional or three-dimensional images by performing a Fourier transformation of raw k-space data, performing other image reconstruction algorithms (e.g., iterative or backprojection reconstruction algorithms), applying filters to raw k-space data or to reconstructed images, generating functional magnetic resonance images, or calculating motion or flow images. Optionally, the method for "Image Downsampling Expedited Adaptive Least-squares" ("IDEAL") fitting for magnetic resonance ("MR") image approach may be implemented here, such as described in U.S. Application Ser. No. 62/473,800.

Images reconstructed by the data processing server 414 are conveyed back to the operator workstation 402 for storage. Real-time images may be stored in a data base memory cache, from which they may be output to operator display 402 or a display 436. Batch mode images or selected real time images may be stored in a host database on disc storage 438. When such images have been reconstructed and transferred to storage, the data processing server 414 may notify the data store server 416 on the operator workstation 402. The operator workstation 402 may be used by an operator to archive the images, produce films, or send the images via a network to other facilities.

The MR system 400 may also include one or more networked workstations 442. For example, a networked workstation 442 may include a display 444, one or more input devices 446 (e.g., a keyboard, a mouse), and a processor 448. The networked workstation 442 may be located within the same facility as the operator workstation 402, or in a different facility, such as a different healthcare institution or clinic.

The networked workstation 442 may gain remote access to the data processing server 414 or data store server 416 via the communication system 440. Accordingly, multiple networked workstations 442 may have access to the data processing server 414 and the data store server 416. In this manner, magnetic resonance data, reconstructed images, or other data may be exchanged between the data processing server 414 or the data store server 416 and the networked workstations 442, such that the data or images may be remotely processed by a networked workstation 442.

EXAMPLES

The following examples set forth, in detail, ways in which the present disclosure may be used or implemented. The following examples are presented by way of illustration and are not meant to be limiting in any way.

CEST MRI has shown promise in clinical tissue characterization. As detailed above, in vivo CEST imaging such as APT MRI is challenging due to the concomitant factors such as RF spillover, macromolecular MTC, and NOE. The commonly used asymmetry analysis ($MTR_{asym}$) suppresses RF spillover effect, yet it is susceptible to up-field NOE and asymmetric MT effects. Recently, an analytical steady-state CEST solution has been derived that solves RF spillover effect. As described above, the present disclosure provides a system and method for a non-linear background correction, dubbed DISC-CEST analysis that is used for quantification of in vivo CEST measurement.

The DISC-CEST techniques described above were tested in a classical 2-pool creatine-gel CEST phantom and demonstrated the DISC-CEST contrast had much stronger correlation with $MTR_{asym}$ than the previously proposed three-offset method, which showed substantial underestimation.

The DISC-CEST approach was then evaluated in normal rat brains, revealing significantly stronger APT effect in gray matter and higher NOE effect in white matter. Furthermore, The DISC-CEST approach was then used to derive both APT and NOE maps in a rat model of glioma, and revealed significantly higher APT effect in the tumors than contralateral normal tissue but no apparent difference in NOE. The DISC-CEST techniques, by correction of non-linear spillover effect, serve as an alternative to both the commonly-used $MTR_{asym}$ and the simplistic three-offset analyses for in vivo quantitative CEST analysis.

Phantom Studies:

CEST phantoms were prepared with creatine (Cr) and low gelling point agarose (Sigma Aldrich, St. Louis, Mo.). Briefly, 1% agarose was added to phosphate-buffered saline (PBS) solution doped with 30 μM gadolinium (Bayer HealthCare, Whippany, N.J.). The mixture was microwave-heated and immersed in a water bath at 50° C. The mixture was titrated to pH 6.75 (EuTech Instrument, Singapore). Cr was added to the gel solution to reach concentrations of 10, 20, 30, 40 and 50 mM, respectively. Each concentration of solution was transferred into separate 5 mm NMR tubes. Afterward, the tubes were sealed and inserted into a phantom container filled with 1% empty gel.

Tumor Model:

Animal experiments were performed in accordance with institutional guidelines, as approved by the Institutional Animal Care and Use Committees, Massachusetts General Hospital (IACUC, MGH). $2 \times 10^5$ cells of the non-infiltrating D74-rat glioma model were injected into the right frontal lobe of adult male Fischer 344 rats (N=8), as previously described (Fulci et al., 2006). The animals were imaged 11-13 days after tumor implantation.

MRI scans were performed on a 4.7 Tesla scanner (Bruker Biospec, Ettlingen, Germany). For the phantom study, CEST MRI was obtained with single-slice, single-shot EPI (field of view (FOV)=50×50 mm², matrix=96×96, slice thickness=5 mm). Z-spectrum was acquired from −3 ppm to 3 ppm with intervals of 0.0625 ppm and a series of RF irradiation power level of 0.5, 0.75, 1, 1.25 and 1.5 μT. The repetition time (TR)/saturation time (TS)/echo time (TE) was 10 s/5 s/50 ms, number of average (NSA)=2. For the in vivo study, multi-slice MRI (FOV=20×20 mm², matrix=64×64, 5 slices, slice thickness/gap=1.8/0.2 mm) was acquired with single-shot EPI. Z-spectrum was obtained from −6 ppm to 6 ppm with intervals of 0.25 ppm and RF irradiation power level of 0.75 μT, TR/TS/TE=10 s/5 s/15 ms, NSA=2 and scan time=8 min 20 s. In addition, $T_1$-weighted images were acquired with seven inversion delays ranging from 250 ms to 3,000 ms (TR/TE=6,500/28 ms, NSA=4); $T_2$-weigthed images were obtained with two TE of 30 and 100 ms (TR=3,250 ms, NSA=16).

Data were processed in MATLAB (MathWorks, Natick, Mass.). Background noise was removed from the acquired CEST data by using the background noise correction as described in Eqns. 3-5. The boundary offsets with minimum residual CEST effect from the peak were chosen. The three-offset method and the $MTR_{asym}$ method were also calculated for comparison with the DISC-CEST method, as described above. Parametric $T_1$ maps were derived using least-squares fitting of the signal as functions of inversion time, as shown by:

$$I = I_0[1-(1+\eta)]e^{-TI/T_1} \quad \text{(Eq. 9)};$$

where η is the inversion efficiency, TI is the inversion time, and $I_0$ is the equilibrium signal. Parametric T2 maps were generated using the following:

$$T_2 = \frac{TE_2 - TE_1}{\ln\left(\frac{I(TE_1)}{I(TE_2)}\right)}; \quad \text{(Eq. 10)}$$

where $TE_{1,2}$ were approximately 30 and 100 ms, respectively. The regions of interest (ROIs) at cortex and corpus callosum were used for analyzing the CEST data of brain WM and GM. The ROIs of tumors were defined based on T1 map and mirrored to the contralateral hemisphere after a slight adjustment for the shifted midline.

Figure 5B:
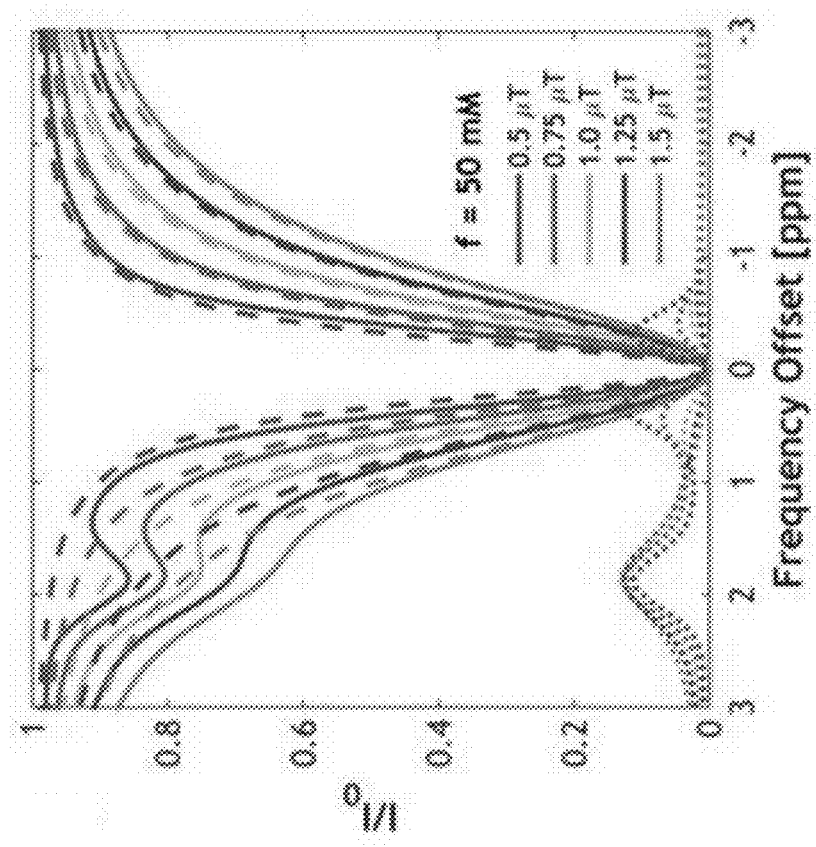
FIG. 5B is a graph that shows a comparison between experimentally measured Z (solid lines), direct saturation estimation (dash lines), and the spillover corrected ΔZ at varied RF saturation levels.
Figure 5A:
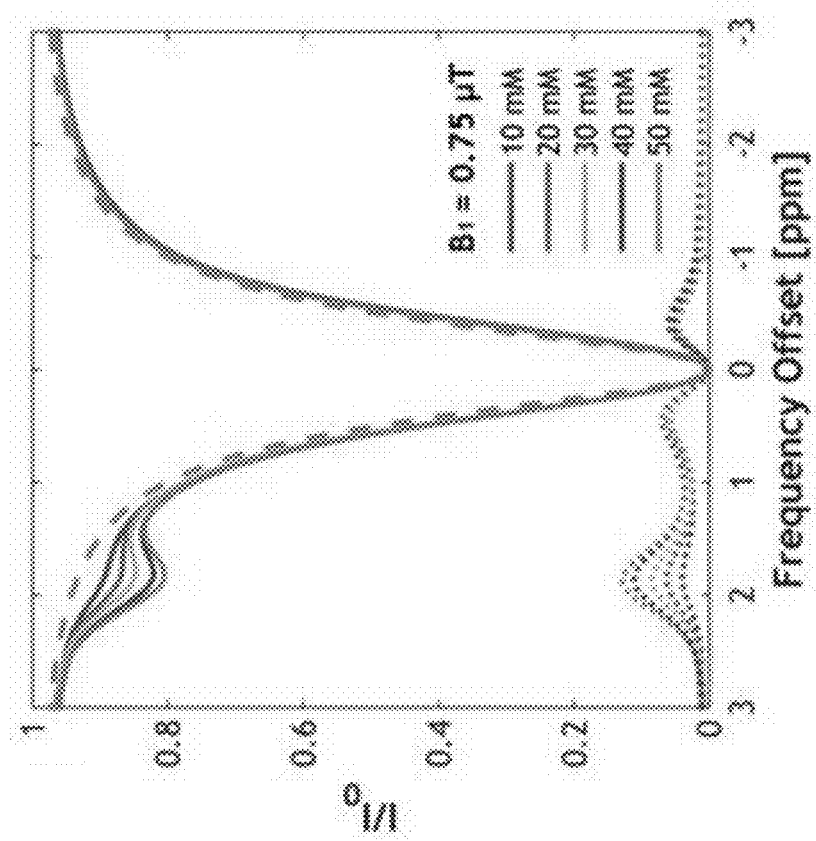
FIG. 5A is a graph that shows the experimentally measured Z-spectrum for creatine at 5 concentrations (Z, solid lines), the analytic estimation of direct water saturation effect using relaxation measurements (Z', dash lines) and their differences which is direct saturation corrected (ΔZ, dotted lines).

Phantom Study Results:

FIG. 5a shows the experimentally measured Z-spectra (solid) for 5 creatine (Cr) concentrations, ranging from 10 mM to 50 mM, (B1=0.75 μT) and the analytic estimation of RF spillover effect (dashed) based on Eq. 3, with their difference (ΔZ, dotted). Both $MTR_{asym}$ from experimentally measured Z-spectra and ΔZ reveal Cr guanidinium proton CEST effect at 1.9 ppm, which increases with Cr concentration. The ΔZ approach provides satisfactory spillover correction, showing more distinct Cr CEST peaks than the Z-spectra. FIG. 5b compares Z, Z' and ΔZ of one creatine concentration at varied saturation power. The ΔZ suppressed the RF spillover effectively at different B1. More importantly, the ΔZ revealed more distinguishable Cr peaks than the Z-spectra, even at large B1.

Figure 6C:
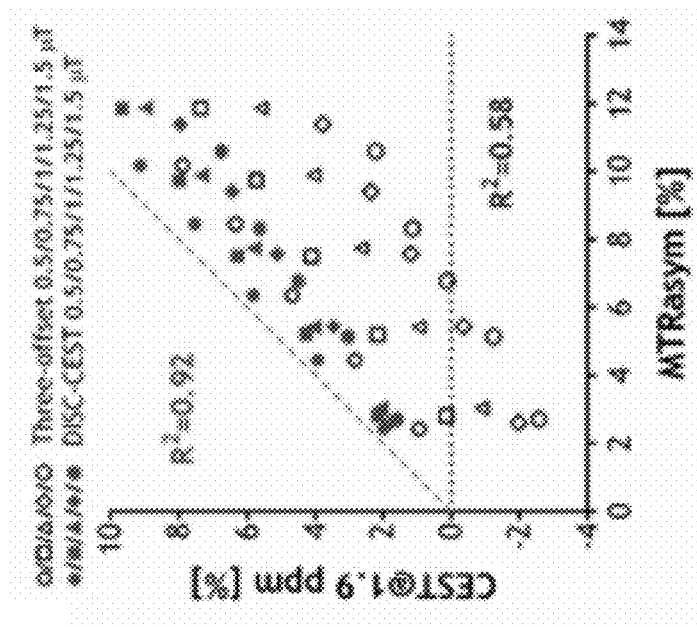
FIG. 6C is a graph showing results of a regression analysis to analyze correlation of $MTR_{asym}$ to both the three-offset method and the non-linear direct saturation correction method.
Figure 6B:
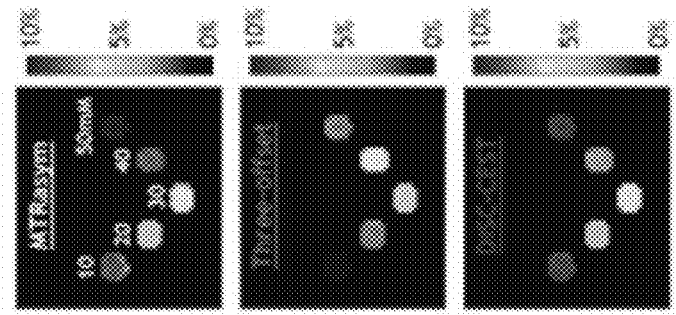
FIG. 6B is a set of correlated images from an identical creatine phantom that, together, provide a comparison of the $MTR_{asym}$ method, three-offset method, and the non-linear direct saturation correction method for generating CEST images specific to metabolite such as creatine in this non-limiting example.
Figure 6A:
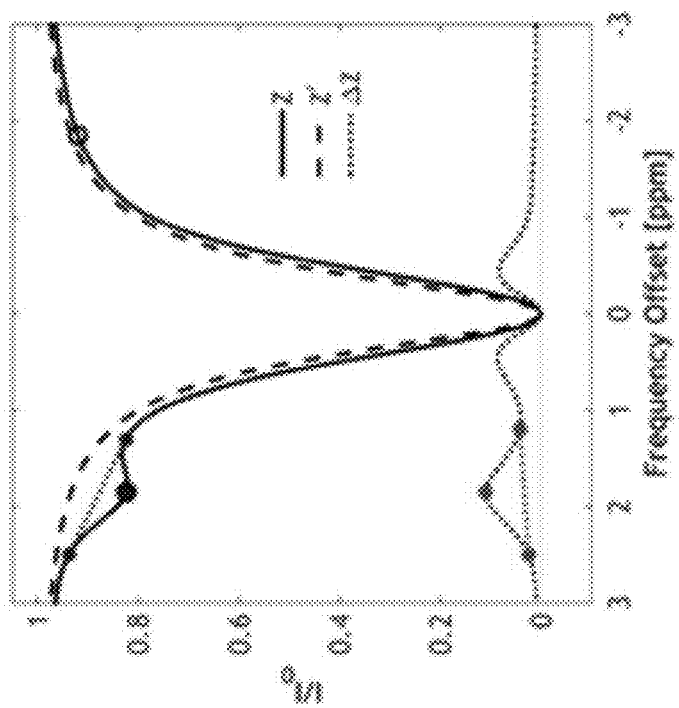
FIG. 6A is a graph that shows a comparison of the $MTR_{asym}$ method, three-offset method, and the non-linear correction of the direct water saturation effect in a creatine phantom with minimal NOE and MTC effects to illustrate the concept of the method according to one aspect of the present disclosure.

The three-offset analysis was analyzed on the experimental data (Z) and the proposed DISC-CEST approach using the spillover corrected ΔZ, and compared them with $MTR_{asym}$ (FIGS. 6A-C). Because creatine has negligible up-field CEST effect, $MTR_{asym}$ provides reliable CEST effect calculation with minimal confounding contribution. The three-offset method assumes that the spillover effect between the two boundary frequency offsets is approximately linear (blue dotted lines, FIG. 6A), which deviates from the non-linear spillover effect estimated using Eq. 5 (dashed line). This discrepancy is minimal for a narrow Cr CEST peak with a flat baseline in ΔZ (red dotted lines, FIG. 6A). FIG. 6B shows that Cr CEST image from the three-offset method had generally smaller CEST effect than $MTR_{asym}$ approach, with an underestimation of 55.5±23.4% (B1=0.75 μT). In comparison, the Cr CEST map from the DISC-CEST approach was closer to $MTR_{asym}$, with their difference being 18.7±2.8%. Regression analysis showed noticeably higher correlation between the DISC-CEST approach and $MTR_{asym}$ than the original three-offset method (FIG. 6C).

In Vivo Study: Normal Rats

Figure 7B:
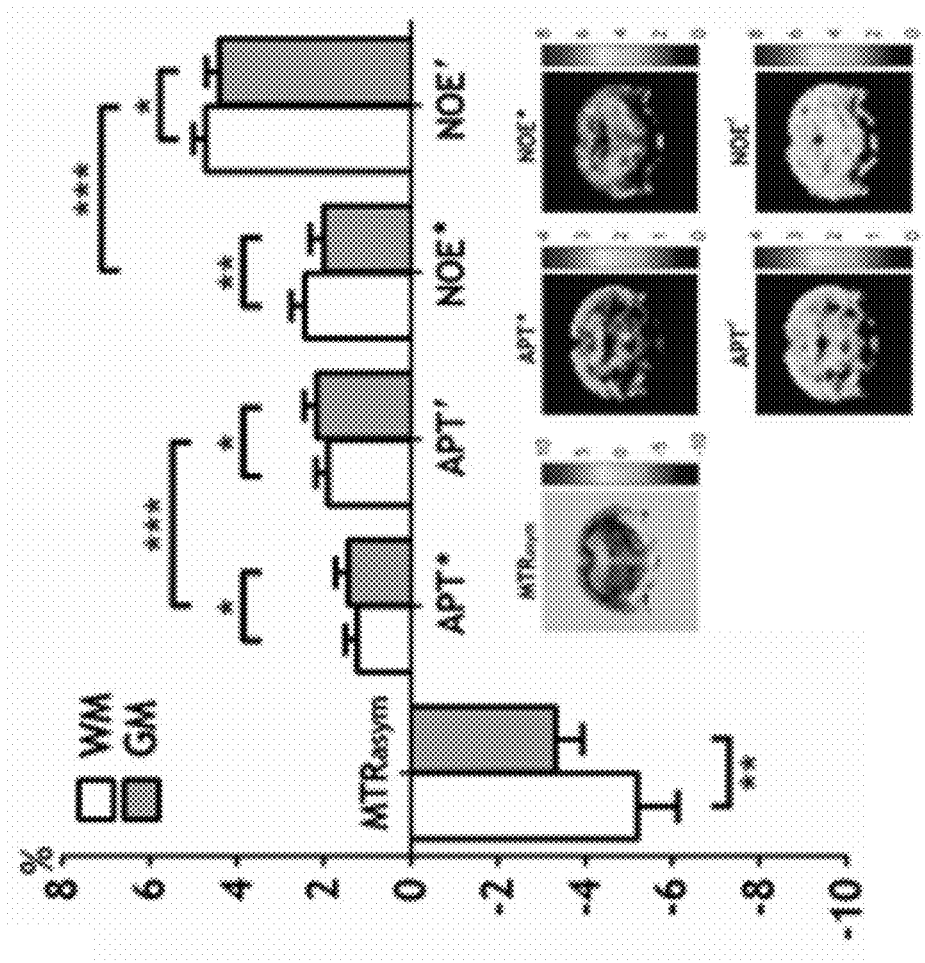
FIG. 7B is a chart showing a comparison of $MTR_{asym}$, APT* and NOE* effects estimated from three-offset method on Z, APT' and NOE' effects from DISC-CEST method on ΔZ between WM and GM of normal brains (N=6).
Figure 7A:
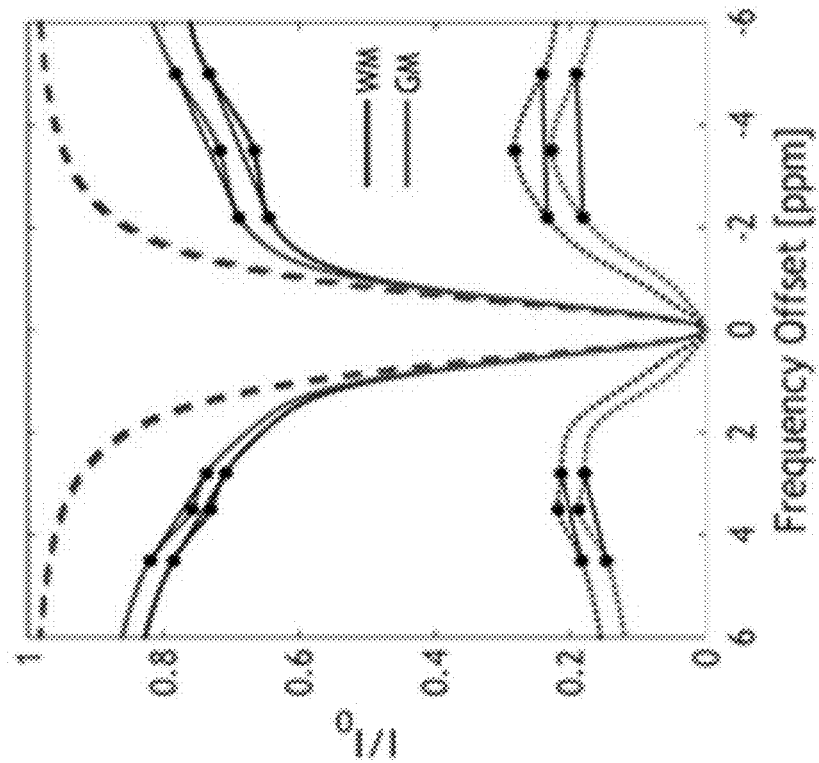
FIG. 7A is a graph showing a comparison of Z, Z', and spillover corrected ΔZ of white matter (WM) and gray matter (GM) from a normal rat brain.

The proposed DISC-CEST method was evaluated in comparison with $MTR_{asym}$ and the three-offset method in normal rat brains. FIG. 7A shows the averaged Z, Z' and ΔZ from the ROIs of WM and GM. Distinct APT peaks at +3.5 ppm and NOE peaks at −3.5 ppm were observed in Z and ΔZ. The boundary offsets of each peak were found to be +2.8 ppm and +4.5 ppm for APT and −2.3 ppm and −5 ppm for NOE. FIG. 7B compares the $MTR_{asym}$, APT* and NOE* effects estimated from the three-offset method, and APT' and NOE' effects from the DISC-CEST approach, between WM and GM of normal brains (N=6). Despite significant contrast between WM and GM, the $MTR_{asym}$ maps were generally negative, due to confounding strong upfield NOE and slightly asymmetric MT effects. Both the three-offset and DISC-CEST analyses revealed significantly stronger APT effect and smaller NOE effect in GM than WM. In addition, the newly proposed approach provided significantly stronger APT' and NOE' than the three-offset approach (i.e., APT* and NOE*).

In Vivo Study: Glioma Rats

Figure 8B:
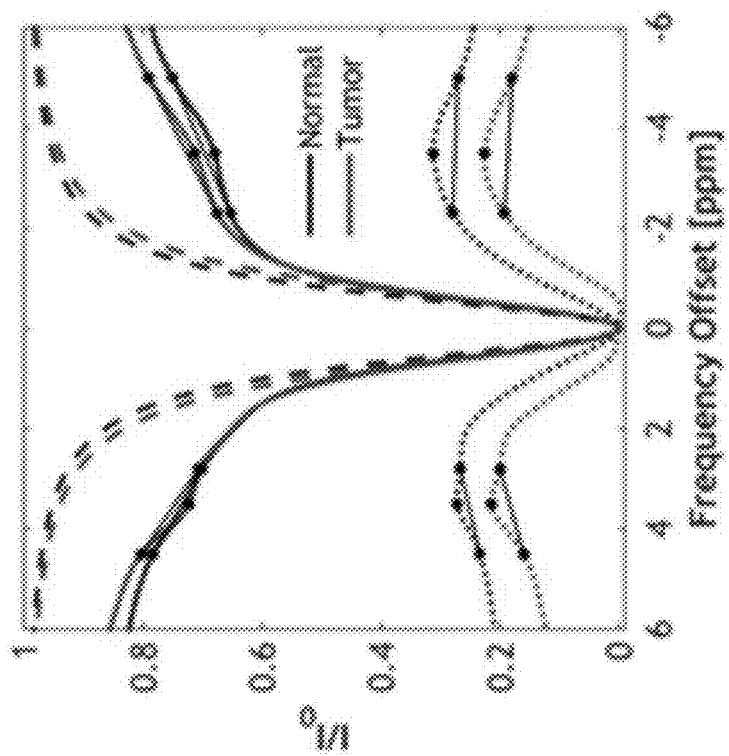
FIG. 8B is a graph showing averaged Z, Z' and ΔZ from the ROIs from the ROIs illustrated in FIG. 8A.
Figure 8A:
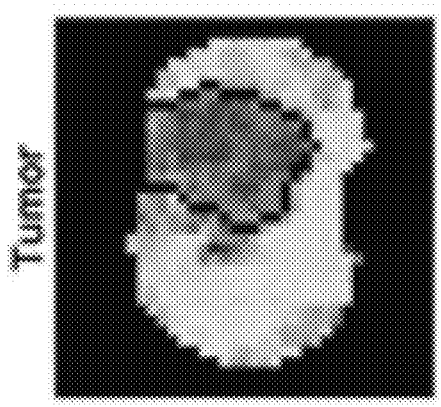
FIG. 8A is a paired set of images that show the regions of interest (ROIs) of the contralateral normal brain tissue and the tumor for subsequent comparison of Z, Z' and ΔZ.
Figure 8A:
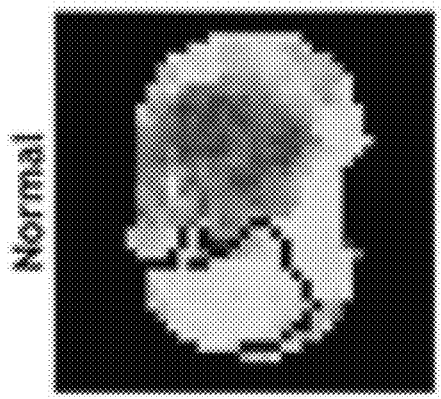

The original three-offset method, DISC-CEST methods, and $MTR_{asym}$ were compared in a rat glioma model. FIG. 8A-B show representative Z, Z' and ΔZ from ROIs of the contralateral normal brain tissue and the tumor. In addition to the bulk water peak and underlying broad MT effect, apparent APT and NOE peaks were present in both Z and ΔZ. The tumor region shows relatively stronger APT effect than the normal tissue. This contrast became more apparent in the RF spillover corrected ΔZ. Interestingly, no apparent difference was observed for the NOE effect between the normal tissue and tumor. For the three-offset and DISC-CEST analyses, the same boundary offsets of APT or NOE peaks as in the normal WM and GM were selected.

Figure 9:
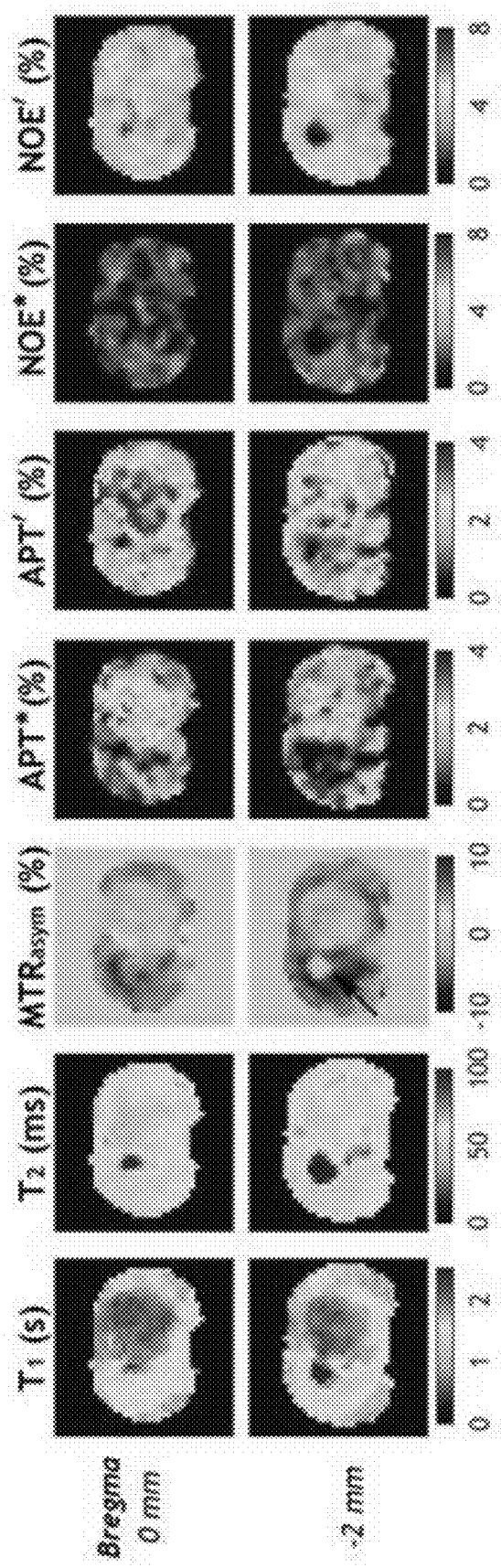
FIG. 9 is a comparison of relaxation maps, $MTR_{asym}$ maps and APT*, APT', NOE*, NOE' maps from two typical slices of a representative rat brain with glioma.

FIG. 9 shows relaxation maps, $MTR_{asym}$ maps and APT*, APT', NOE*, NOE' maps from two typical slices of a representative rat brain with glioma. T1 maps show clear contrast between the tumor and normal brain tissue. T2 map shows a relatively lower T2 in the tumor core with elevated T2 in the tumor rim. The $MTR_{asym}$ maps display a positive contrast in the tumor, but the $MTR_{asym}$ values were negative in the normal tissue due to contamination from upfield NOE effect and asymmetric MT effect.

On the other hand, the cerebrospinal fluid (CSF) appeared hyperintense in $MTR_{asym}$ maps (black arrow, FIG. 9), lowering the specificity of $MTR_{asym}$ increase with protein level change in cancerous tissue. In comparison, the tumor appears hyperintense in both APT* and APT' maps with a substantially stronger contrast observed in the APT' maps. Meanwhile, no obvious difference between the tumor and normal regions was found in NOE* or NOE' maps. The results from all eight tumor rats were summarized in Table 1. The APT' and NOE' effects were significantly higher than the APT* and NOE* (P<0.001, paired t-tests). More importantly, a significant increase in the APT contrast between normal tissue and tumor was found, being APT* 1.04±0.6% and APT' 1.26±0.6% (p<0.001, paired t-tests).

TABLE 1

Comparison of relaxation times, $MTR_{asym}$ and CEST effects estimated using three-offset analysis (APT* and NOE*) and DISC-CEST approach (APT' and NOE') in normal and tumor regions. Mean standard deviation are shown.

| 0.75 μT | Normal | Tumor |
| --- | --- | --- |
| $T_1$ | 1.54 ± 0.13 | 1.97 ± 0.10** |
| $T_2$ | 56.7 ± 2.1 | 53.4 ± 2.4** |
| $MTR_{asym}$ | −3.79 ± 1.61% | −1.25 ± 1.33%* |
| APT* | 1.28 ± 0.58% | 2.32 ± 0.66%** |
| APT' | 1.99 ± 0.56%††† | 3.25 ± 0.61%***††† |
| NOE* | 1.80 ± 0.14% | 1.71 ± 0.69% |
| NOE' | 3.92 ± 0.25%††† | 4.40 ± 0.75%††† |

Paired t-test were performed with *p < 0.001, p < 0.01, *p < 0.05 indicating significant difference between normal and tumor tissues. and †††p < 0.001 indicating significant difference between the three-offset and DISC-CEST analyses (APT* vs. APT', NOE* vs. NOE').

Discussion:

The above-described, non-limiting studies estimated non-linear RF spillover effect from relaxation measurements, correction of which improves in vivo CEST quantification, augmenting both the conventional $MTR_{asym}$ approach and the original three-offset method. Notably, the original three-offset is applicable for cases of high field strength, weak saturation power levels and frequency offsets far from the water resonance, where the spillover effect over the frequency range can be approximated by a linear function. Otherwise, it risks substantial underestimation of CEST effect. The relaxation-based direct saturation correction overcomes these limitations as the results demonstrated improved three-offset determination of CEST effects at 4.7 Tesla for frequency offset as small as 1.9 ppm and saturation power as high as 1.5 μT. The CEST peak after spillover correction has a reasonably linear baseline, which allows delineation of the CEST peak from the baseline that is likely attributable to much broader MT effect. As the linear approximation holds for a much broader frequency range than in the uncorrected Z, the boundary offset shifts, or $δ_{1,2}$, can be slightly larger to minimize residual CEST effect from the peak.

In the normal brain, both the three-offset and DISC-CEST analyses showed stronger APT effect in GM and larger NOE effect in WM, consistent with previous findings. However, the difference between the APT* and NOE* from the original three-offset method was substantially lower than $MTR_{asym}$, indicating non-negligible contribution from macromolecular MTC effect. Interestingly, the DISC-CEST approach yielded much stronger APT' and NOE' values, with their difference closer to $MTR_{asym}$ than that between APT* and NOE*. It is worthwhile to point out that the MT effect induces significant signal drop over a wide frequency range and is slightly asymmetric around the water peak. It can be estimated by fitting wide-offset data with a super-Lorentzian lineshape. Alternatively, the macromolecular MT effect within a small frequency range around the water resonance can be fitted by a Lorentzian line shape without the need of acquiring wide-offset data. However, since the MT is much broader than other major CEST peaks, it can be approximated as a linear function or even a constant over a small frequency range. As such, the residual MT effect has a less impact on the DISC-CEST approach than on $MTR_{asym}$. In this study, we obtain Z-spectrum from −6 to 6 ppm to demonstrate the concept. The DISC-CEST method allows reliable in vivo APT quantification without acquiring the whole Z-spectrum. In theory, it minimally requires three offsets, which drastically reduces the scan time. Meanwhile, acquisition of more offsets can provide more robust correction of field inhomogeneity.

Because tumor has significantly T1 and T2 changes from normal tissue (FIG. 9 and Table 1), it experiences different spillover effects, correction of which is necessary. Using the three-offset or DISC-CEST analyses, significantly higher APT effect was found in the tumors, similar to previous findings from APT imaging of glioma. The APT changes have been suggested to arise from elevated intracellular mobile proteins/peptides concentration. More importantly, the APT' maps show significantly stronger contrast between the normal and tumor tissues than APT* map, which is beneficial for tumor detection, tracking tumor growth and monitoring APT changes in response to treatments. Therefore, the proposed DISC-CEST method allows in vivo APT quantification with better accuracy and can serve as a promising alternative to $MTR_{asym}$ and APT*. Our study found no apparent NOE contrast between the normal tissue and tumor, in line with the previous studies using similar irradiation powers. The NOE quantification has been difficult due to its broad linewidth, which will lead to significant error if the non-linear spillover and macromolecular MT contributions are not well eliminated. Previous NOE measurements with similar saturation powers under the same field strength vary from 8% to 10% in normal brain. In this study, we found the NOE' values are around 4%, which are approximately two times of the NOE* values (2%) but still lower than the literature values. Note the NOE for aliphatic and olefinic protons ranges from 0 to 5 ppm up-field from the water. Therefore, the underestimation in our NOE' measurement likely arose from residual NOE effects in the boundary offsets chosen here, especially −2.3 ppm. Nevertheless, NOE' measurement is sensitive in detecting NOE difference between WM and GM. Further improvement in its accuracy can be achieved by reducing the MT effect from the spillover-corrected Z-spectrum using numerical fitting of a theoretical MT model. Notably, the DISC CEST MRI decuples APT from NOE, which is advantageous when both may alter at the same time.

Figure 10:
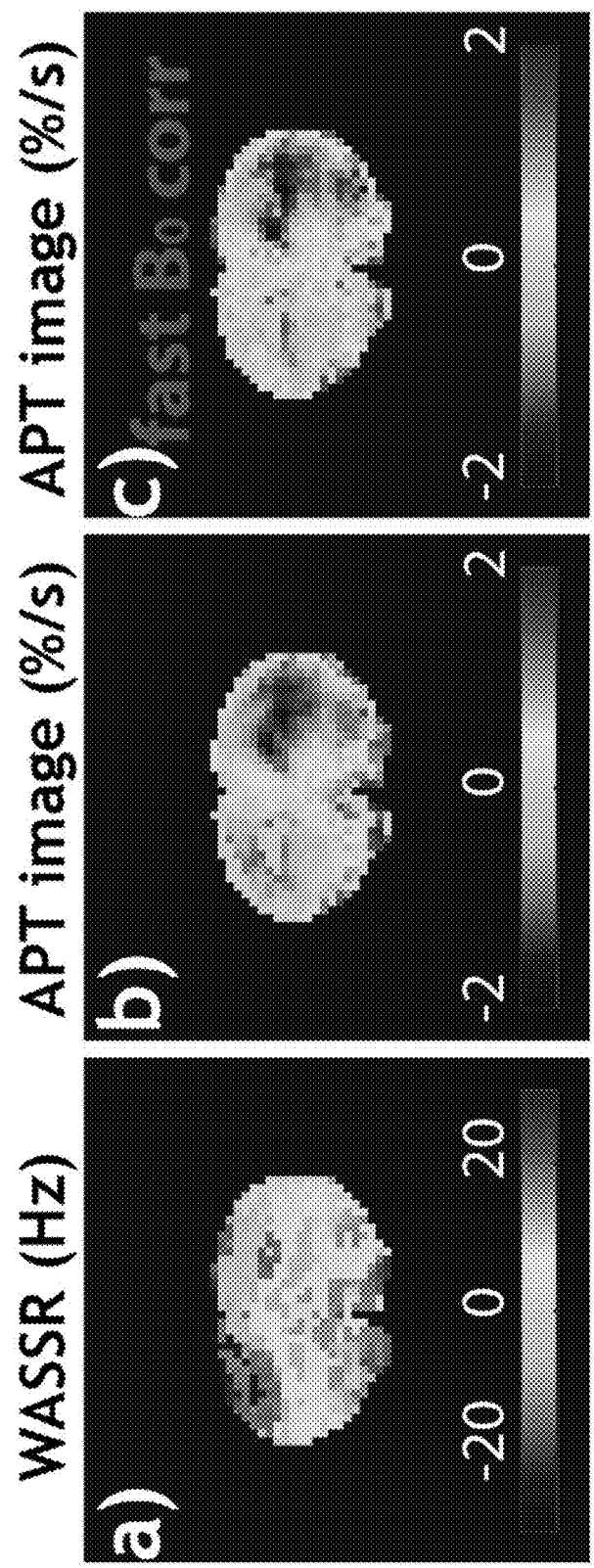
FIG. 10 is a set of APT images from a representative rat brain with acute ischemic stroke without and with correction of B0 inhomogeneity by incorporating the frequency shifts measure from the B0 field map in the estimation of direct water saturation.

The $B_0$ correction approach does not require the interpolation approach based on densely-sampled APT images. During the development of the DISC-MRI, we realized that the dominant $B_0$ inhomogeneity effect is through the non-linear direct saturation effect, which can be estimated from relaxation and B0 field images. For the instance of acute ischemic stroke, as the intact tissue has little pH, the residual inhomogeneity effect can be corrected by including the $B_0$ field map to the analysis for expedient correction as shown in FIG. 10.

Using the direct saturation corrected Z-spectrum ($\Delta Z$), individual CEST effects such as APT, NOE and broad MTC effects can be decoupled with multi-pool Lorentzian fitting method with Eq. 5. FIGS. 11 A-B shows a multi-pool Lorentzian fitting of in vivo CEST Z-spectral images from a representative rat brain with focal ischemic stroke. FIG. 11A is the multi-pool Lorentzian fitting of the averaged Z-spectrum (Z) or direct saturation corrected Z-spectrum ($\Delta Z$) from contralateral normal tissue (green) or ipsilateral ischemic tissue (red). Individual decoupled CEST pools, including water, APT, amine, NOE and MT are also shown (normal: solid lines; ischemic: dotted lines). FIG. 11B is a diffusion and a perfusion MRI map of one ischemic rat brain as well as the decoupled APT, amine, NOE maps using multi-pool Lorentzian fitting of the direct saturation corrected $\Delta Z$.

In accordance with one aspect of the disclosure, a method is provided for producing a magnetic resonance (MR) image of a subject. The method includes applying at least one radiofrequency (RF) saturation pulse with an MRI system at a range of frequencies to substantially saturate magnetization corresponding to an exchangeable proton in the subject, acquiring chemical exchange saturation transfer (CEST) data with the MRI system, and generating an acquired Z-spectrum (Z) from the CEST data. The method also includes computing an estimated direct water saturation (Z') based using at least one of relaxation measurements derived from the CEST data or imaging parameters used to acquire the CEST data with the MRI system, computing a direct saturation corrected Z-spectrum ($\Delta Z$) using the acquired Z-spectrum (Z) and the estimated direct water saturation (Z'), and generating a CEST image of the subject using the direct saturation corrected Z-spectrum ($\Delta Z$).

In accordance with another aspect of the present disclosure, system is provided that includes a magnet system configured to generate a polarizing magnetic field about at least a portion of a subject, a magnetic gradient system including a plurality of magnetic gradient coils configured to apply at least one magnetic gradient field to the polarizing magnetic field, and a radio frequency (RF) system configured to apply an RF field to the subject and to receive magnetic resonance signals from the subject using a coil array. The system also includes a computer system programmed to control the magnetic gradient system and the RF system to perform a pulse sequence that includes at least one RF saturation pulse at a range of frequencies to substantially saturate magnetization corresponding to an exchangeable proton in the subject. The computer system is further programmed to acquire chemical exchange saturation transfer (CEST) data from the subject, generate an acquired Z-spectrum (Z) from the CEST data, and compute an estimated direct water saturation (Z') based using at least one of relaxation measurements derived from the CEST data or imaging parameters used to acquire the CEST data with the MRI system. The computer system is further programmed to determine a direct saturation corrected Z-spectrum ($\Delta Z$) using the Z-spectrum (Z) and the estimated direct water saturation (Z'); and reconstruct a CEST image of the subject using the direct saturation corrected Z-spectrum ($\Delta Z$).

In one aspect of the disclosure, a system is provided that includes a magnet system configured to generate a polarizing magnetic field about at least a portion of a subject. The system includes a magnetic gradient system including a plurality of magnetic gradient coils configured to apply at least one magnetic gradient field to the polarizing magnetic field, and a radio frequency (RF) system configured to apply an RF field to the subject and to receive magnetic resonance signals from the subject using a coil array. The system further includes a computer system programmed to apply at least one radiofrequency (RF) saturation pulse at a range of frequencies to substantially saturate magnetization corresponding to an exchangeable proton group in the subject. The system may then apply at least one radiofrequency (RF) saturation pulse using the RF system at a range of frequencies to substantially saturate magnetization corresponding to an exchangeable proton in the subject. The system then acquires chemical exchange saturation transfer (CEST) data, and generates a Z-spectrum (Z) from the CEST data. The system is further programmed to compute an estimated direct water saturation (Z') based at least in part on relaxation measurements comprising a longitudinal relaxation value ($T_1$) and a traverse relaxation value ($T_2$). The system then generates a direct saturation corrected Z-spectrum ($\Delta Z$) by subtracting the Z-spectrum and the estimated direct water saturation, and generates a CEST image of the subject based at least in part on the direct saturation corrected Z-spectrum using a frequency offset method.

In other aspects of the disclosure, a method is provided for producing a magnetic resonance (MR) image of a subject. The method steps comprise applying at least one radiofrequency (RF) saturation pulse with an MRI system at a range of frequencies to substantially saturate magnetization corresponding to an exchangeable proton in the subject. The method further including acquiring chemical exchange saturation transfer (CEST) data with the MRI system, and generating a Z-spectrum (Z) from the CEST data. An estimated direct water saturation (Z') is then computed based at least in part on relaxation measurements comprising a longitudinal relaxation value $T_1$ and a traverse relaxation value $T_2$. A direct saturation corrected Z-spectrum ($\Delta Z$) is then computed by subtracting the Z-spectrum and the estimated direct water saturation. A CEST image of the subject is then generated based at least in part on the direct saturation corrected Z-spectrum.

In other aspects of the disclosure, a method is provided for producing a magnetic resonance (MR) image of a subject. The method steps comprise applying at least one radiofrequency (RF) saturation pulse with an MRI system at a range of frequencies to substantially saturate magnetization corresponding to an exchangeable proton in the subject. The method further including acquiring chemical exchange saturation transfer (CEST) data with the MRI system, and generating a Z-spectrum (Z) from the CEST data. An estimated direct water saturation (Z') comprising a nonlinear function is then computed. A direct saturation corrected Z-spectrum (ΔZ) is then computed by subtracting the Z-spectrum and the estimated direct water saturation. A CEST image of the subject is then generated using a frequency offset method.

We claim:

1. A method for producing a magnetic resonance (MR) image of a subject, the method comprising:
   a) applying at least one radiofrequency (RF) saturation pulse with an MRI system at a range of frequencies to substantially saturate magnetization corresponding to an exchangeable proton in the subject;
   b) acquiring chemical exchange saturation transfer (CEST) data with the MRI system;
   c) generating an acquired Z-spectrum (Z) from the CEST data;
   d) computing an estimated direct water saturation (Z') based using at least one of relaxation measurements derived from the CEST data or imaging parameters used to acquire the CEST data with the MRI system;
   e) computing a direct saturation corrected Z-spectrum (ΔZ) using the acquired Z-spectrum (Z) and the estimated direct water saturation (Z'); and
   f) generating a CEST image of the subject using the direct saturation corrected Z-spectrum (ΔZ), and
   wherein generating the CEST image includes using a frequency offset method utilizing a frequency offset of interest (Δw), a first offset shift ($\delta_1$), and a second offset shift ($\delta_2$).

2. The method of claim 1, wherein the relaxation measurements include relaxation recovery times or saturation times.

3. The method of claim 2, wherein the relaxation recover times include longitudinal and traverse relaxation rates of bulk water.

4. The method of claim 1, further comprising performing a multi-pool Lorentzian fitting to generate the CEST image.

5. The method of claim 1, wherein the estimated direct water saturation (Z') comprises a non-linear function.

6. The method of claim 1, wherein the estimated direct water saturation (Z') comprises:

$$Z' = \frac{(1 - e^{-T_r R_{1w}}) \cdot e^{-R_{1p} \cdot T_s} + \frac{R_{1w} \cos^2\theta}{R_{1p}} \cdot (1 - e^{-R_{1p} \cdot T_s})}{1 - \cos(FA) \cdot e^{-T_r R_{1w}} \cdot e^{-R_{1p} \cdot T_s}}{(1 - e^{-T_r R_{1w}})/(1 - \cos(FA) \cdot e^{-T_r R_{1w}})}$$

where Tr is a relaxation recovery time; Ts is a saturation time; TR is a repetition time given by Tr+Ts; FA is the image excitation flip angle; $R_{1,2w}$ is bulk water longitudinal and traverse relaxation rates, given by $R_{1p} = R_{1w} \cos^2\theta + R_{2w} \sin^2\theta$; and $\theta = \tan^{-1}(\omega_1/\Delta\omega)$ where $\omega_1$ and $\Delta\omega$ are the RF irradiation level and offset, respectively.

7. The method of claim 1, further comprising performing a multi-pool Lorentzian fitting to generate the CEST image that determines the direct saturation corrected Z-spectrum (ΔZ) as:

$$\Delta Z = \sum_{i=1}^{N} \frac{A_i}{1 + 4\left(\frac{\omega - \omega_i}{\sigma_i}\right)^2}$$

where ω is a water resonance frequency offset, $A_i$ is an amplitude of a CEST peak for a proton pool i, $\omega_i$, is a frequency offset of the CEST peak for the proton pool i, and $\sigma_i$ is a linewidth of the CEST peak for the proton pool i.

8. The method of claim 1, wherein the first offset shift is different than the second offset shift.

9. The method of claim 1, wherein the frequency offset of interest (Δω) is determined from a difference between a labeling frequency of a metabolite and a water resonance frequency.

10. The method of claim 1, wherein the metabolite comprises a functional group that is selected from the group consisting of an amine, an amide, and a hydroxyl group.

11. The method of claim 1, further comprising controlling $B_0$ field inhomogeneity effects by adjusting the frequency offset of interest (Δω) based at least in part on a $B_0$ field map.

12. The method of claim 1, wherein the first offset shift ($\delta_1$), and the second offset shift ($\delta_2$) are determined by choosing a peak in the Z-spectrum with a minimum residual CEST effect.

13. The method of claim 1, wherein computing the direct saturation corrected Z-spectrum (ΔZ) includes subtracting the acquired Z-spectrum (Z) and the estimated direct water saturation (Z').

14. A method for producing a magnetic resonance (MR) image of a subject, the method comprising:
   a) applying at least one radiofrequency (RF) saturation pulse with an MRI system at a range of frequencies to substantially saturate magnetization corresponding to an exchangeable proton in the subject
   b) acquiring chemical exchange saturation transfer (CEST) data with the MRI system,
   c) generating an acquired Z-spectrum (Z) from the CEST data;
   d) computing an estimated direct water saturation (Z') based using at least one of relaxation measurements derived from the CEST data or imaging parameters used to acquire the CEST data with the MRI system,
   e) computing a direct saturation corrected Z-spectrum (ΔZ) using the acquired Z-spectrum (Z) and the estimated direct water saturation (Z'), and
   f) generating a CEST image of the subject using the direct saturation corrected Z-spectrum (ΔZ), and wherein generating the CEST image further includes decoupling individual CEST effects including amide proton transfer (APT), nuclear overhauser enhancement (NOE), and broad asymmetric magnetization transfer contrasts (MTC) from the CEST image.

15. A system comprising:
   a magnet system configured to generate a polarizing magnetic field about at least a portion of a subject;
   a magnetic gradient system including a plurality of magnetic gradient coils configured to apply at least one magnetic gradient field to the polarizing magnetic field;
   a radio frequency (RF) system configured to apply an RF field to the subject and to receive magnetic resonance signals from the subject using a coil array;
   a computer system programmed to:
   a) control the magnetic gradient system and the RF system to perform a pulse sequence that includes at least one RF saturation pulse at a range of frequencies to substantially saturate magnetization corresponding to an exchangeable proton in the subject;
   b) acquire chemical exchange saturation transfer (CEST) data from the subject;

c) generate an acquired Z-spectrum (Z) from the CEST data;
d) compute an estimated direct water saturation (Z') based using at least one of relaxation measurements derived from the CEST data or imaging parameters used to acquire the CEST data with the MRI system;
e) determine a direct saturation corrected Z-spectrum (ΔZ) using the Z-spectrum (Z) and the estimated direct water saturation (Z'); and
f) reconstruct a CEST image of the subject using the direct saturation corrected Z-spectrum (ΔZ) and wherein generating the CEST image includes using a frequency offset method utilizing a frequency offset of interest ($\Delta\omega$), a first offset shift ($\delta_1$), and a second offset shift ($\delta_2$).

16. The system of claim 15, wherein the relaxation measurements include relaxation recovery times or saturation times.

17. The system of claim 15, wherein the computer system is further programmed to decouple individual CEST effects including amide proton transfer (APT), nuclear overhauser enhancement (NOE), and broad asymmetric magnetization transfer contrasts (MTC) from the CEST data to reconstruct the CEST image.

18. The system of claim 15, wherein the estimated direct water saturation (Z') comprises a non-linear function.

19. The system of claim 15, wherein the estimated direct water saturation (Z') is calculated by the computer system as:

$$Z' = \frac{(1 - e^{-T_r R_{1w}}) \cdot e^{-R_{1p} \cdot T_s} + \frac{R_{1w}\cos^2\theta}{R_{1p}} \cdot (1 - e^{-R_{1p} \cdot T_s})}{\frac{1 - \cos(FA) \cdot e^{-T_r R_{1w}} \cdot e^{-R_{1p} \cdot T_s}}{(1 - e^{-T_r R_{1w}})/(1 - \cos(FA) \cdot e^{-T_r R_{1w}})}}$$

where Tr is a relaxation recovery time; Ts is a saturation time; TR is a repetition time given by Tr+Ts; FA is the image excitation flip angle; $R_{1,2w}$ is bulk water longitudinal and traverse relaxation rates, given by $R_{1p}=R_{1w}\cos^2\theta+R_{2w}\sin^2\theta$; and $\theta=\tan^{-1}(\omega_1/\Delta\omega)$ where $\omega_1$ on and $\Delta\omega$ are the RF irradiation level and offset, respectively.

* * * * *